(12) United States Patent
Powell et al.

(10) Patent No.: US 9,305,889 B2
(45) Date of Patent: *Apr. 5, 2016

(54) LEADLESS INTEGRATED CIRCUIT PACKAGE HAVING STANDOFF CONTACTS AND DIE ATTACH PAD

(71) Applicant: UTAC Hong Kong Limited, Tsuen Wan (CN)

(72) Inventors: Kirk Powell, Greeley, CO (US); John McMillan, Seaview, WA (US); Adonis Fung, Tsing Yi (HK); Serafin P. Pedron, Jr., Manteca, CA (US)

(73) Assignee: UTAC Hong Kong Limited, Hong Kong (HK)

( * ) Notice: Subject to any disclaimer, the term of this patent is extended or adjusted under 35 U.S.C. 154(b) by 0 days.

This patent is subject to a terminal disclaimer.

(21) Appl. No.: 14/287,603

(22) Filed: May 27, 2014

(65) Prior Publication Data

US 2014/0367865 A1 Dec. 18, 2014

Related U.S. Application Data

(60) Continuation of application No. 12/775,711, filed on May 7, 2010, now Pat. No. 8,736,037, which is a division of application No. 12/400,391, filed on Mar. 9, 2009, now Pat. No. 7,858,443.

(51) Int. Cl.
*H01L 23/00* (2006.01)

(52) U.S. Cl.
CPC ............. *H01L 24/05* (2013.01); *H01L 2224/04* (2013.01)

(58) Field of Classification Search
CPC ....... H01L 23/00; H01L 23/495; H01L 24/05; H01L 23/485; H01L 23/498; H01L 23/48; H01L 23/52; H01L 23/488
USPC ......... 257/777, 666, 690, 676, 687, 688, 734, 257/767, 775, 779, 780, 781, 782, 784, 787
See application file for complete search history.

(56) References Cited

U.S. PATENT DOCUMENTS

| | | | |
|---|---|---|---|
| 6,011,304 A | 1/2000 | Mertol | |
| 6,552,428 B1 | 4/2003 | Huang et al. | |
| 7,060,535 B1 * | 6/2006 | Sirinorakul et al. | 438/123 |
| 7,459,347 B2 * | 12/2008 | Shimanuki et al. | 438/123 |
| 8,072,053 B2 * | 12/2011 | Li | 257/676 |
| 8,237,250 B2 * | 8/2012 | Chang Chien et al. | 257/676 |
| 8,610,262 B1 | 12/2013 | Mclellan et al. | |
| 8,736,037 B2 * | 5/2014 | Powell et al. | 257/676 |
| 2004/0046241 A1 | 3/2004 | Combs et al. | |
| 2005/0263864 A1 * | 12/2005 | Islam et al. | 257/676 |

* cited by examiner

*Primary Examiner* — Chuong A Luu
(74) *Attorney, Agent, or Firm* — Winstead PC

(57) ABSTRACT

A leadless integrated circuit (IC) package comprising an IC chip mounted on a die attach pad and a plurality of electrical contacts electrically connected to the IC chip. The IC chip, the electrical contacts, and the die attach pad are all covered with a molding material, with portions of the electrical contacts and die attach pad protruding from a bottom surface of the molding material.

10 Claims, 24 Drawing Sheets

SIDE VIEW

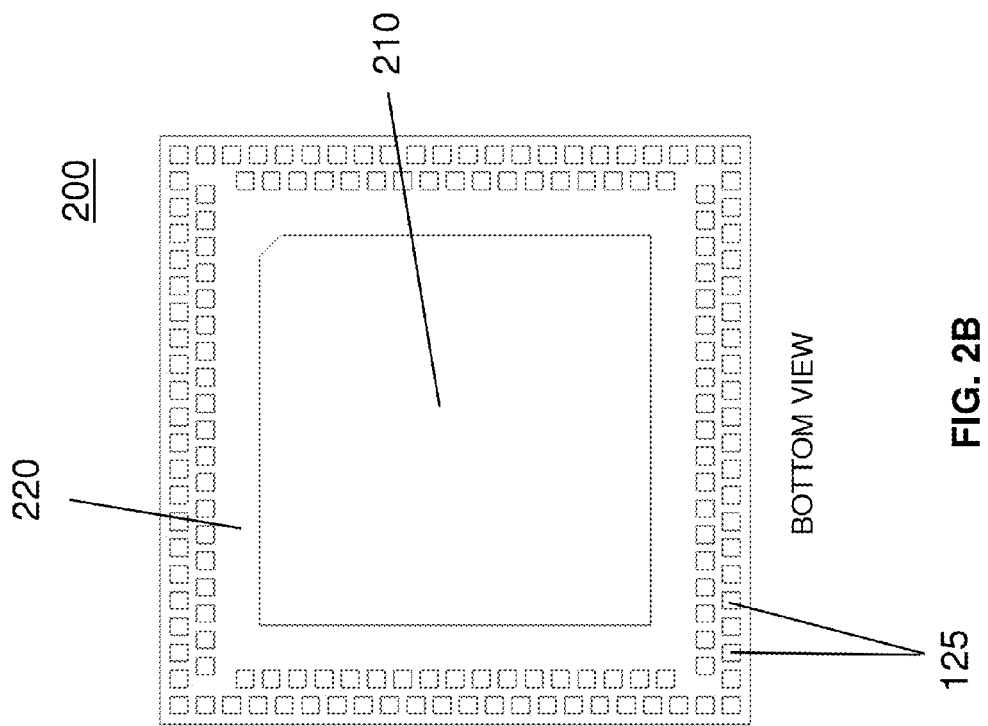
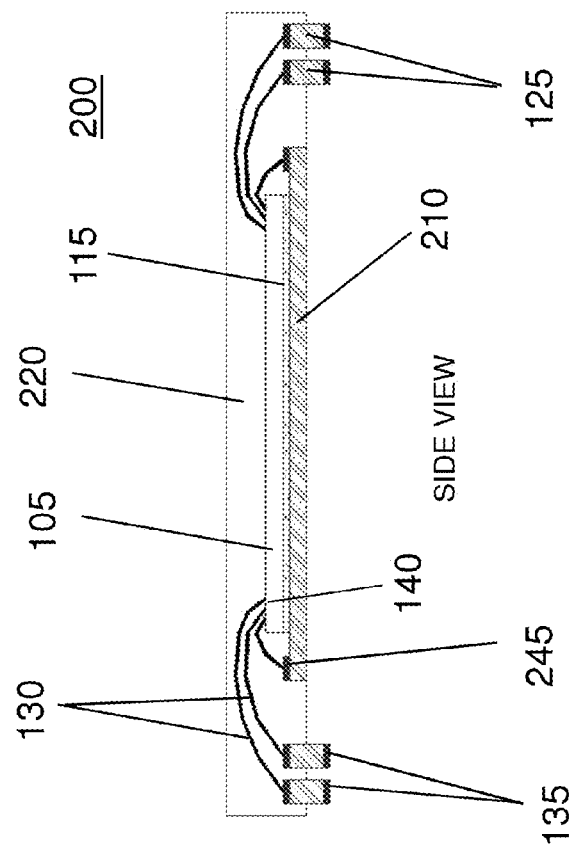
FIG. 2B
FIG. 2A

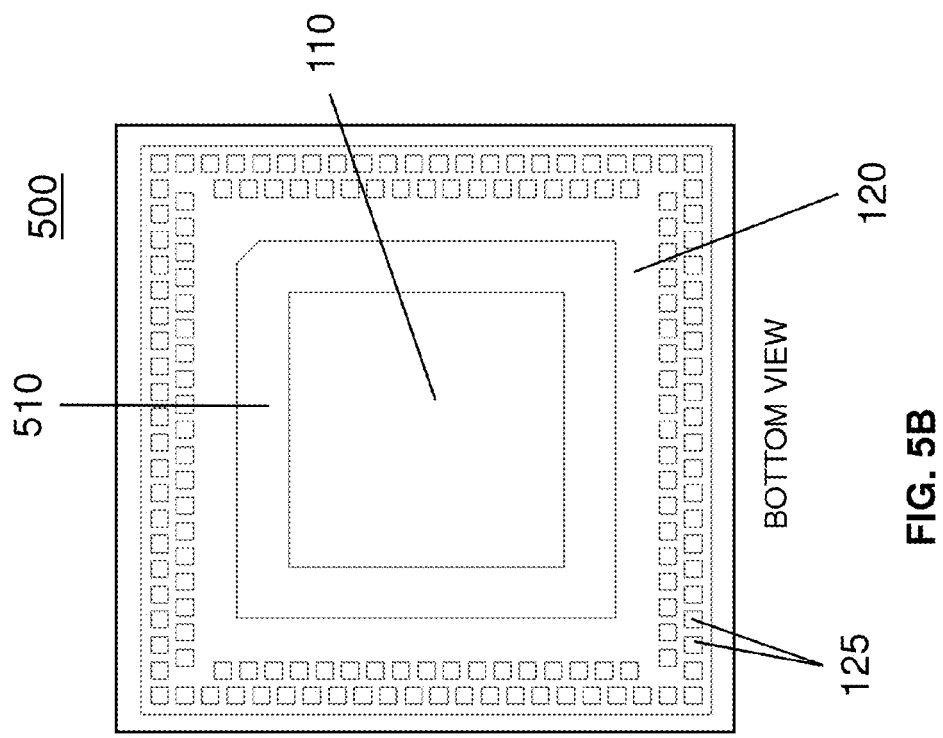
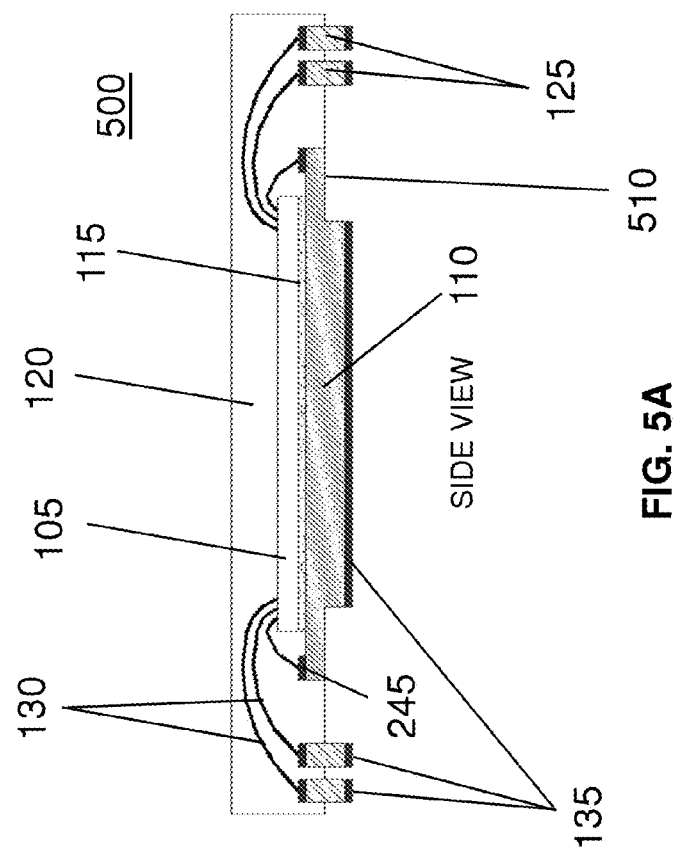
FIG. 5A
FIG. 5B

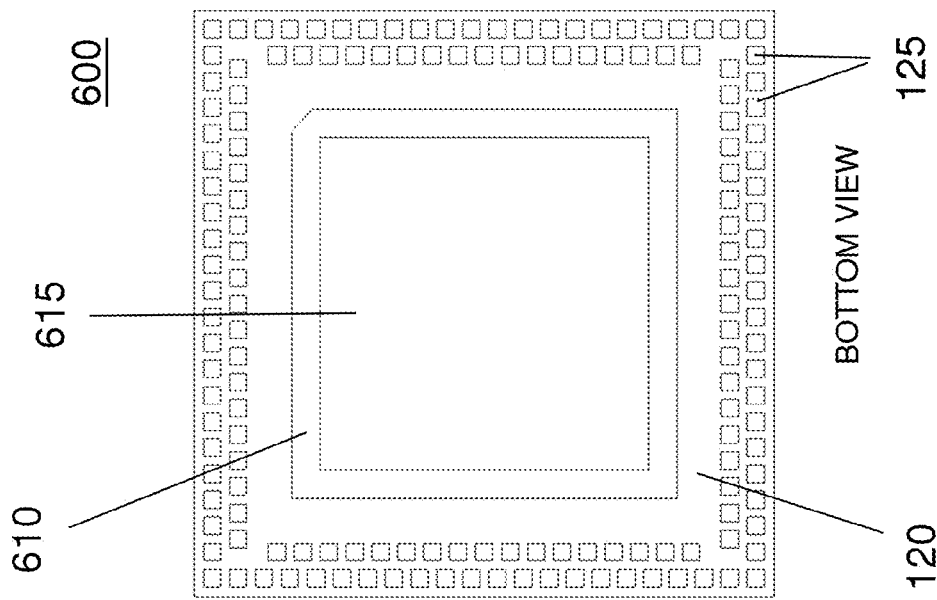
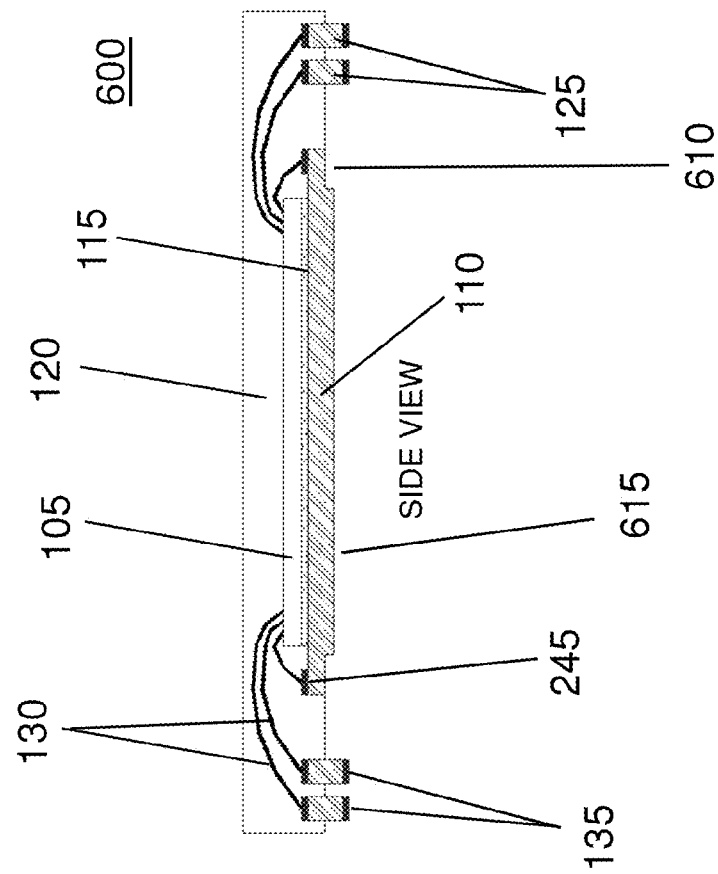
FIG. 6B
FIG. 6A

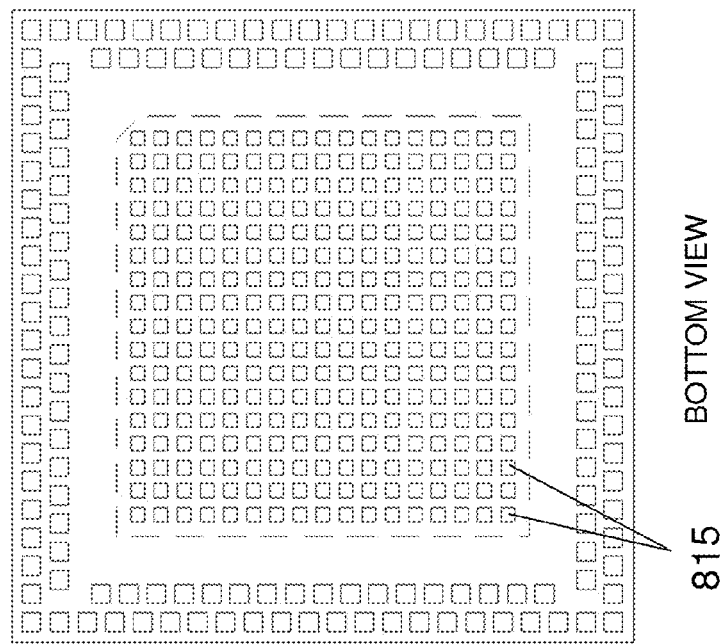
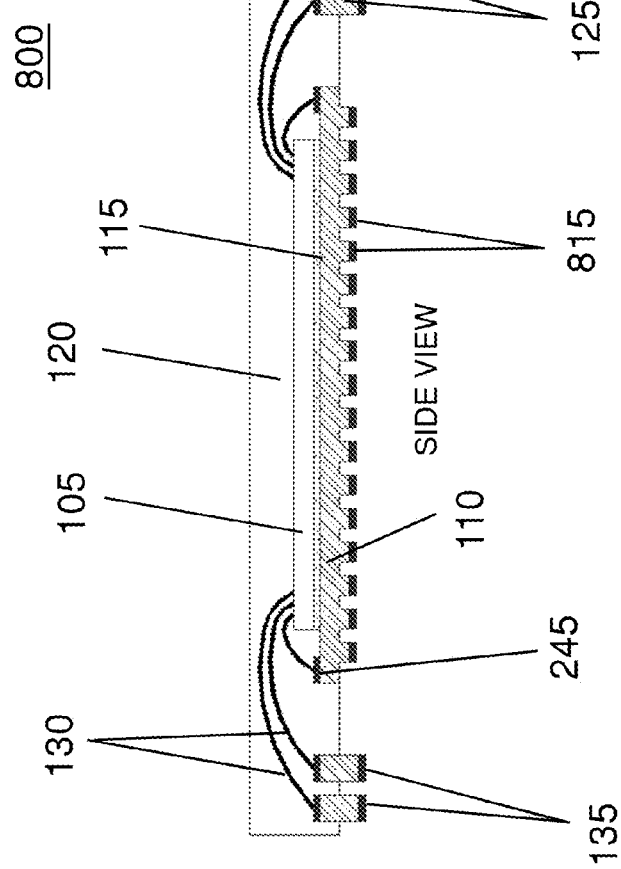

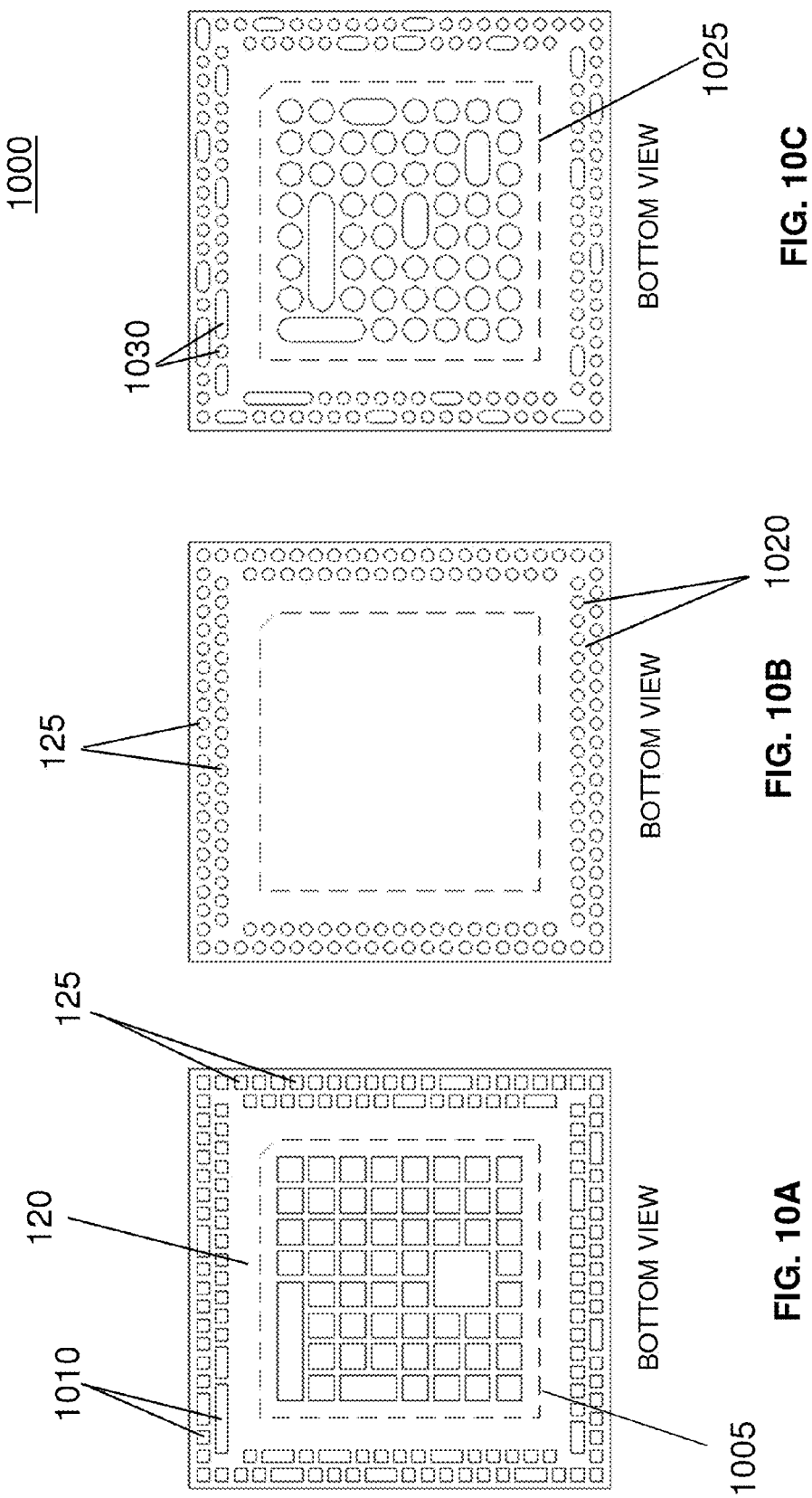

BOTTOM VIEW

SIDE VIEW

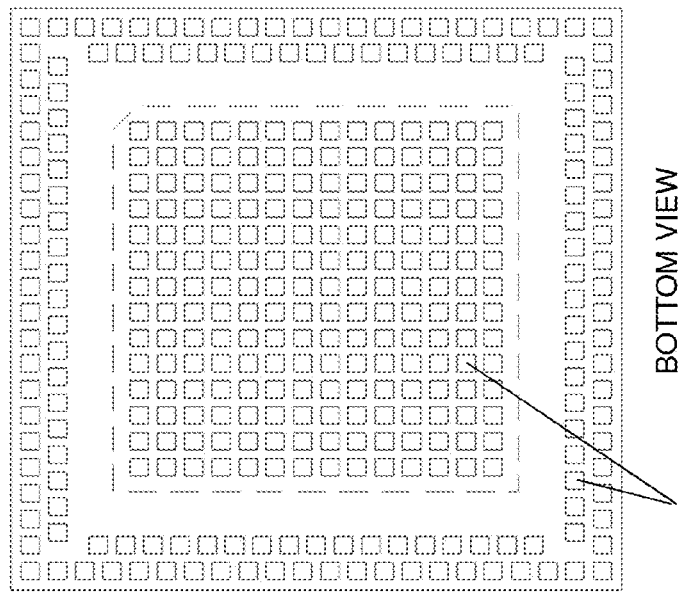
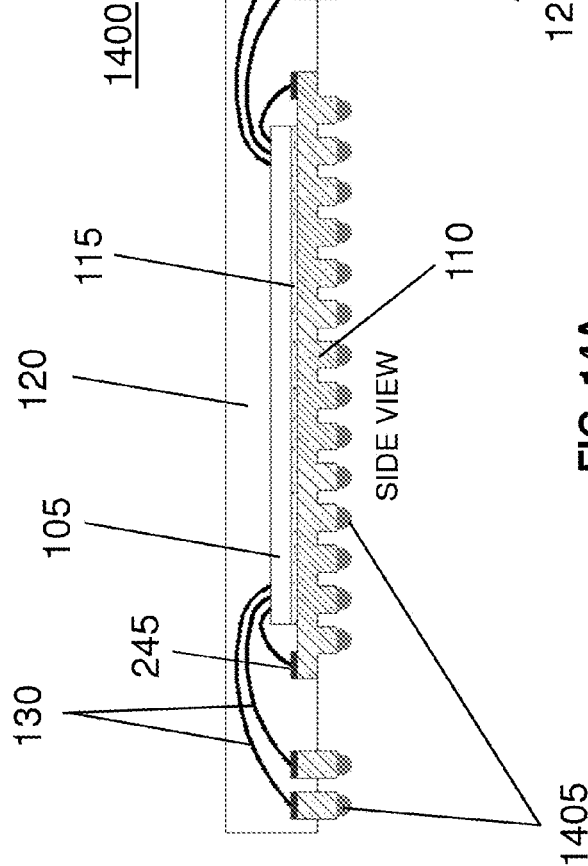
FIG. 14A
FIG. 14B

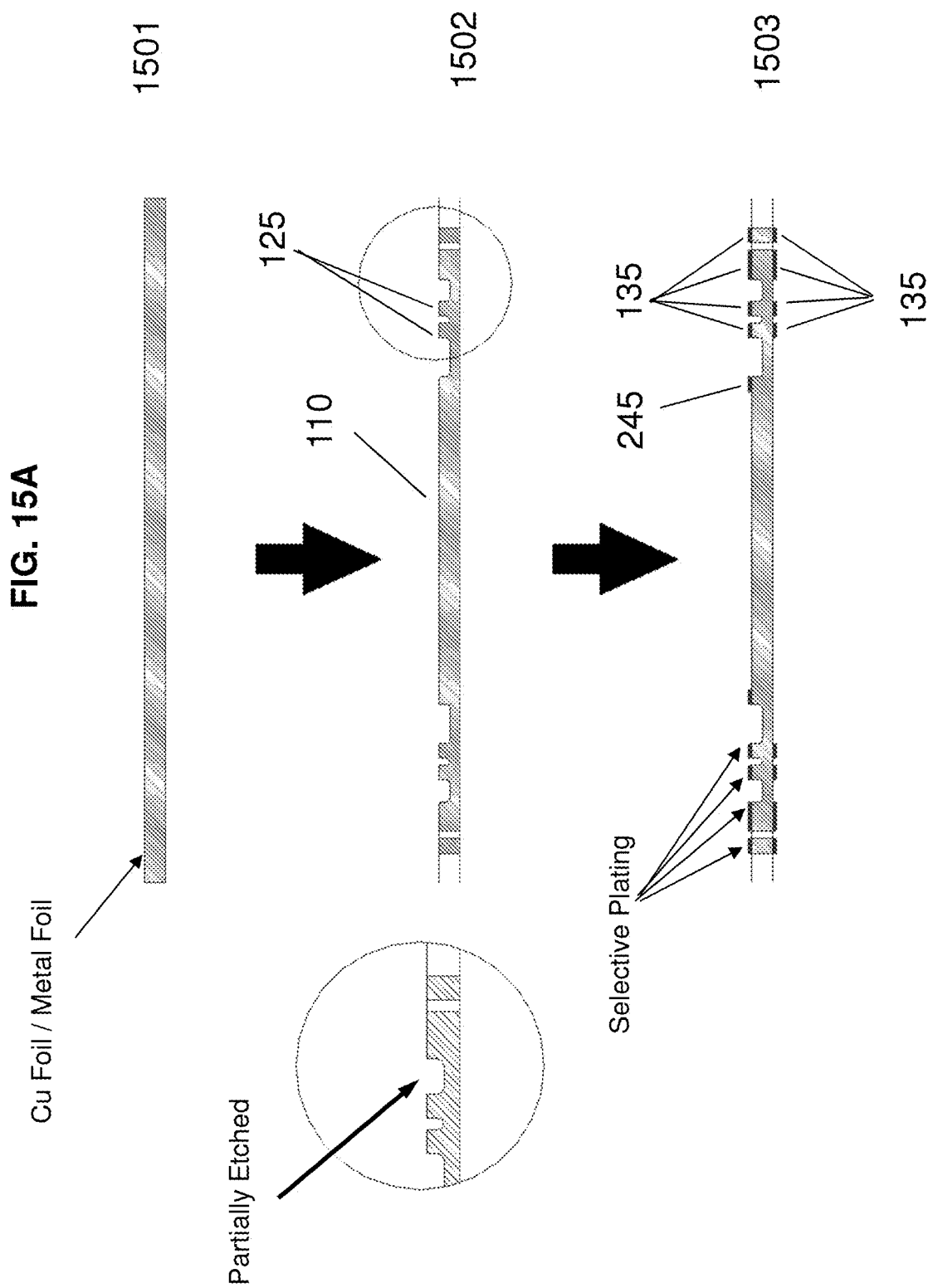

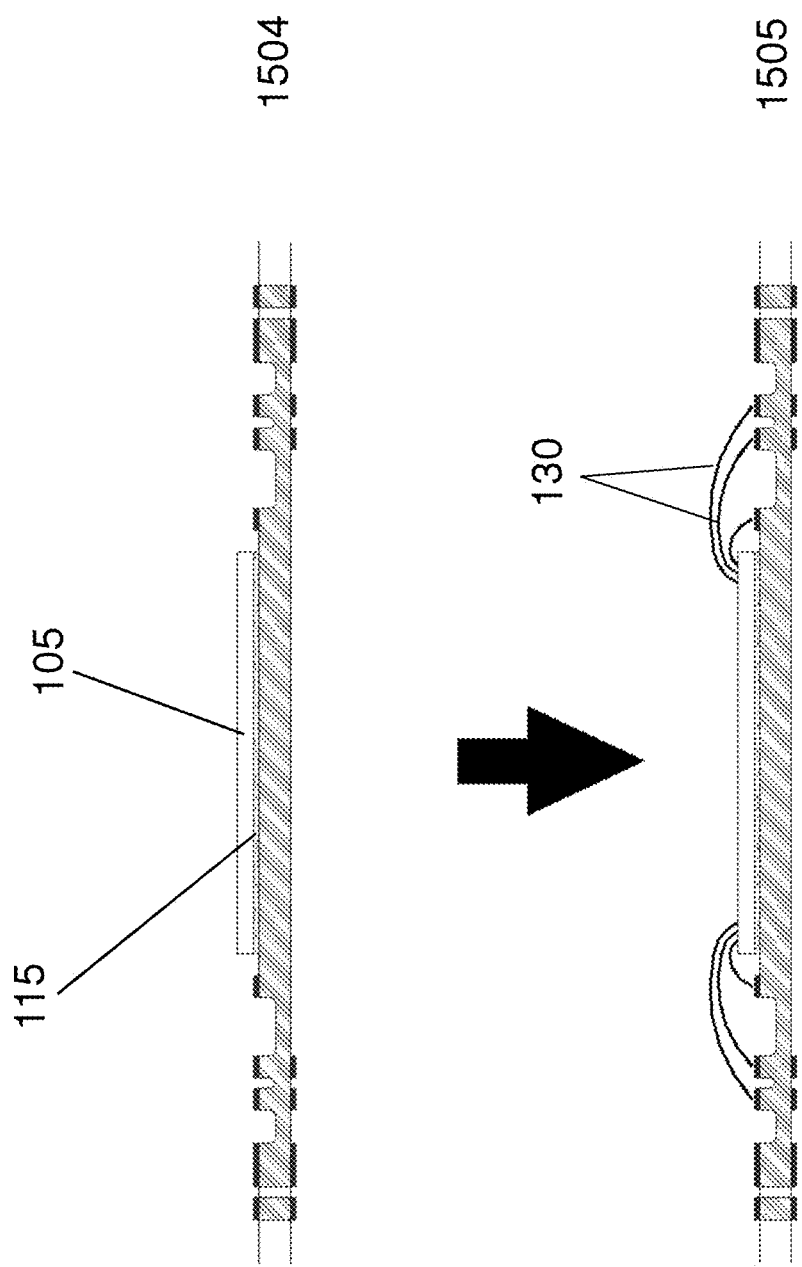

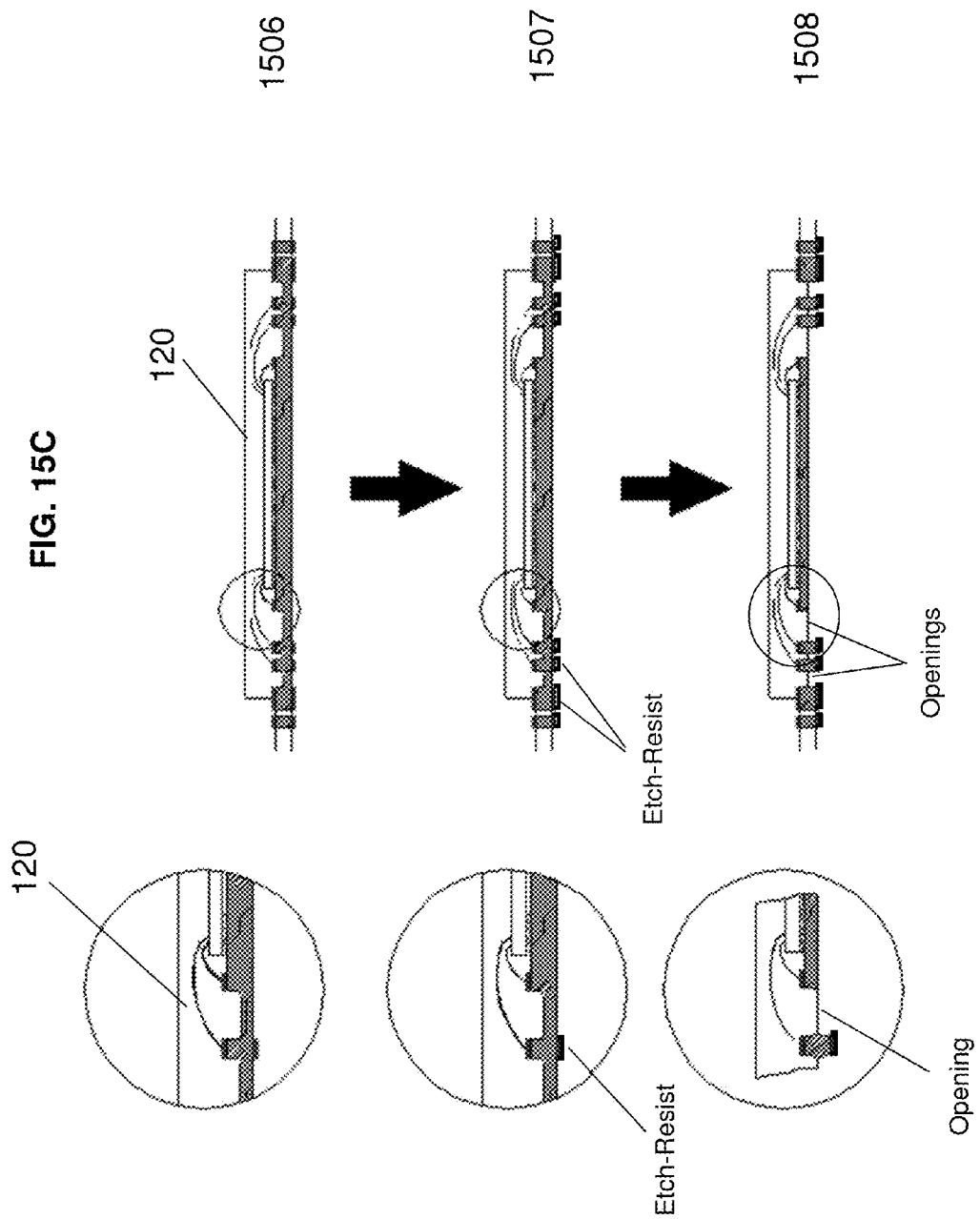

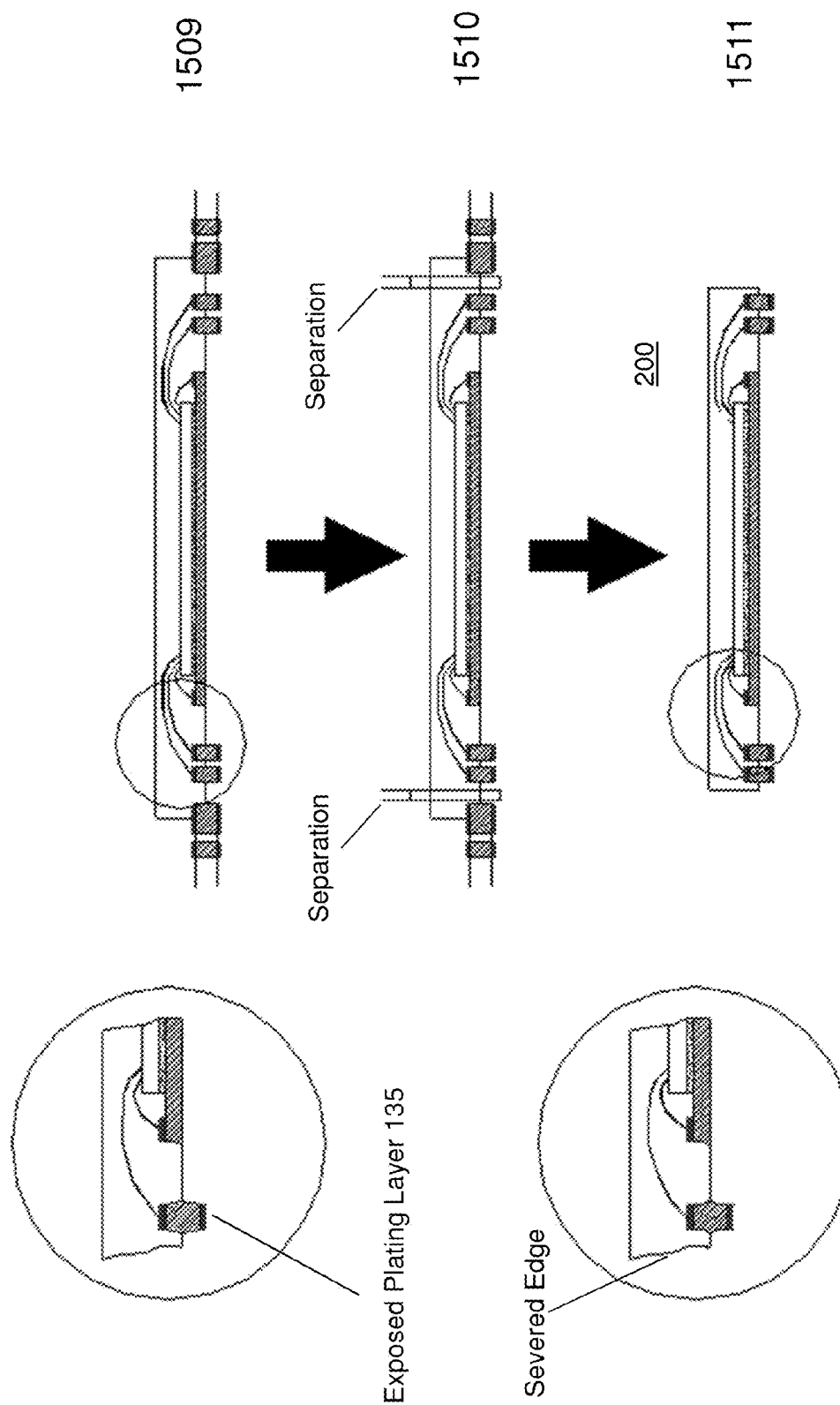

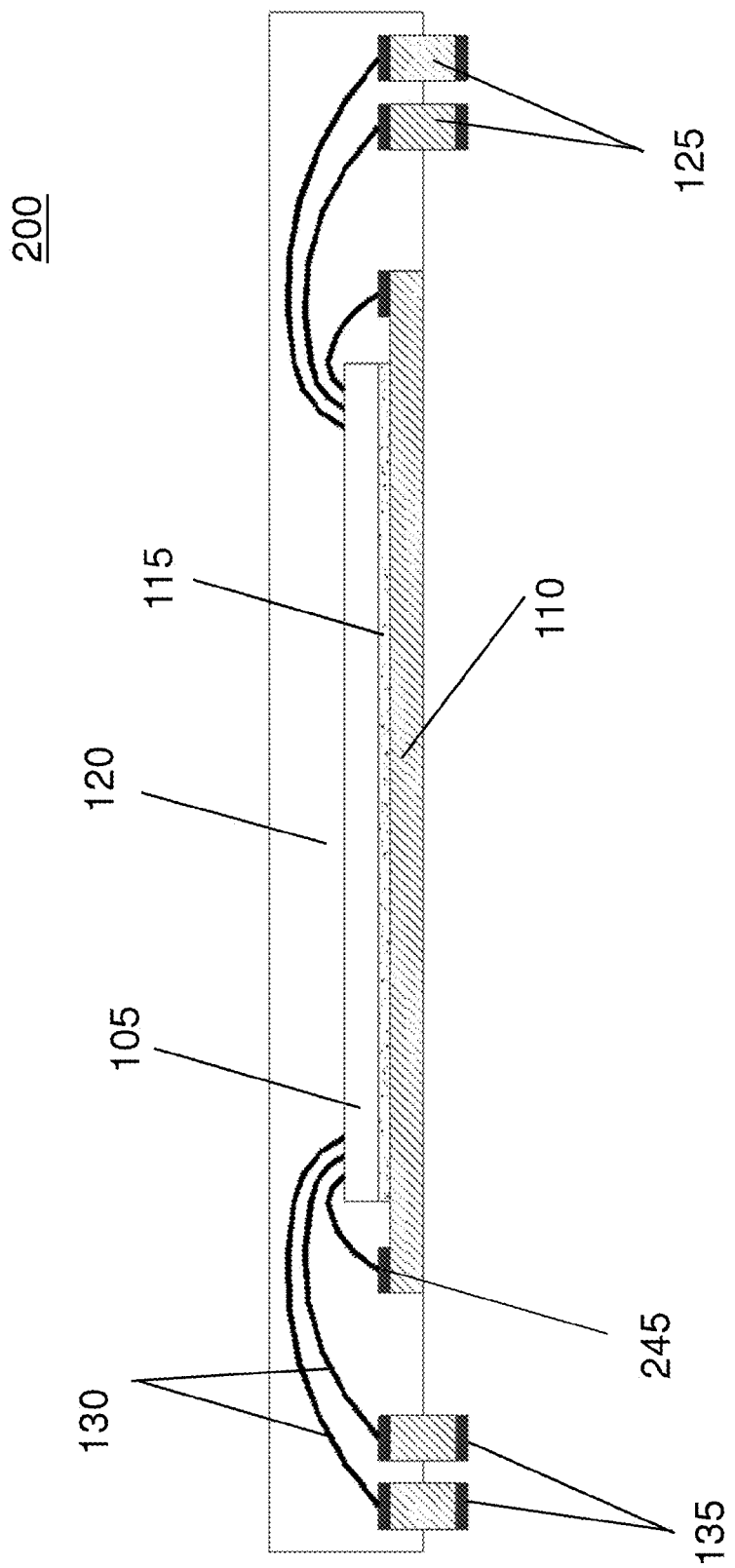

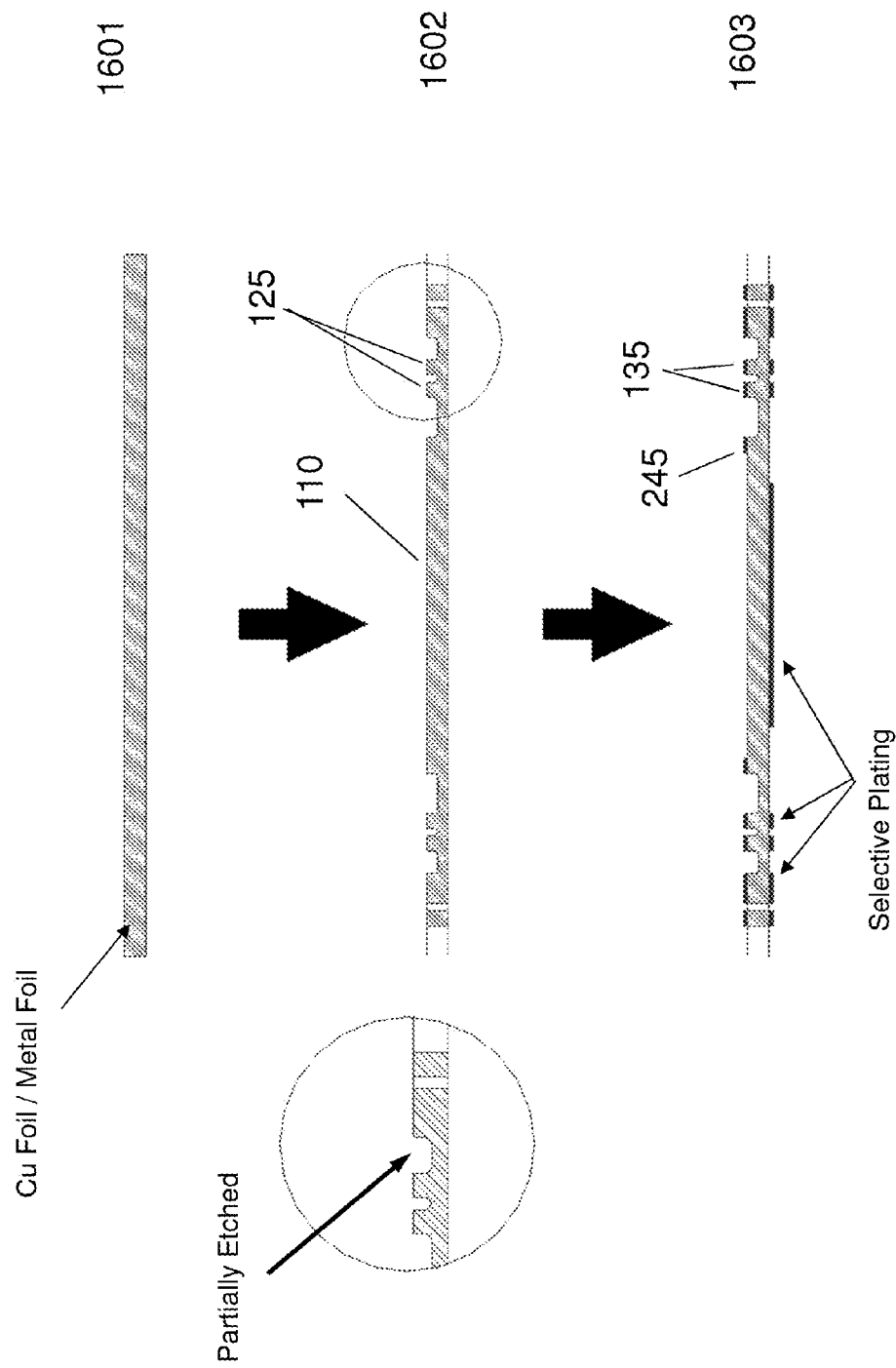

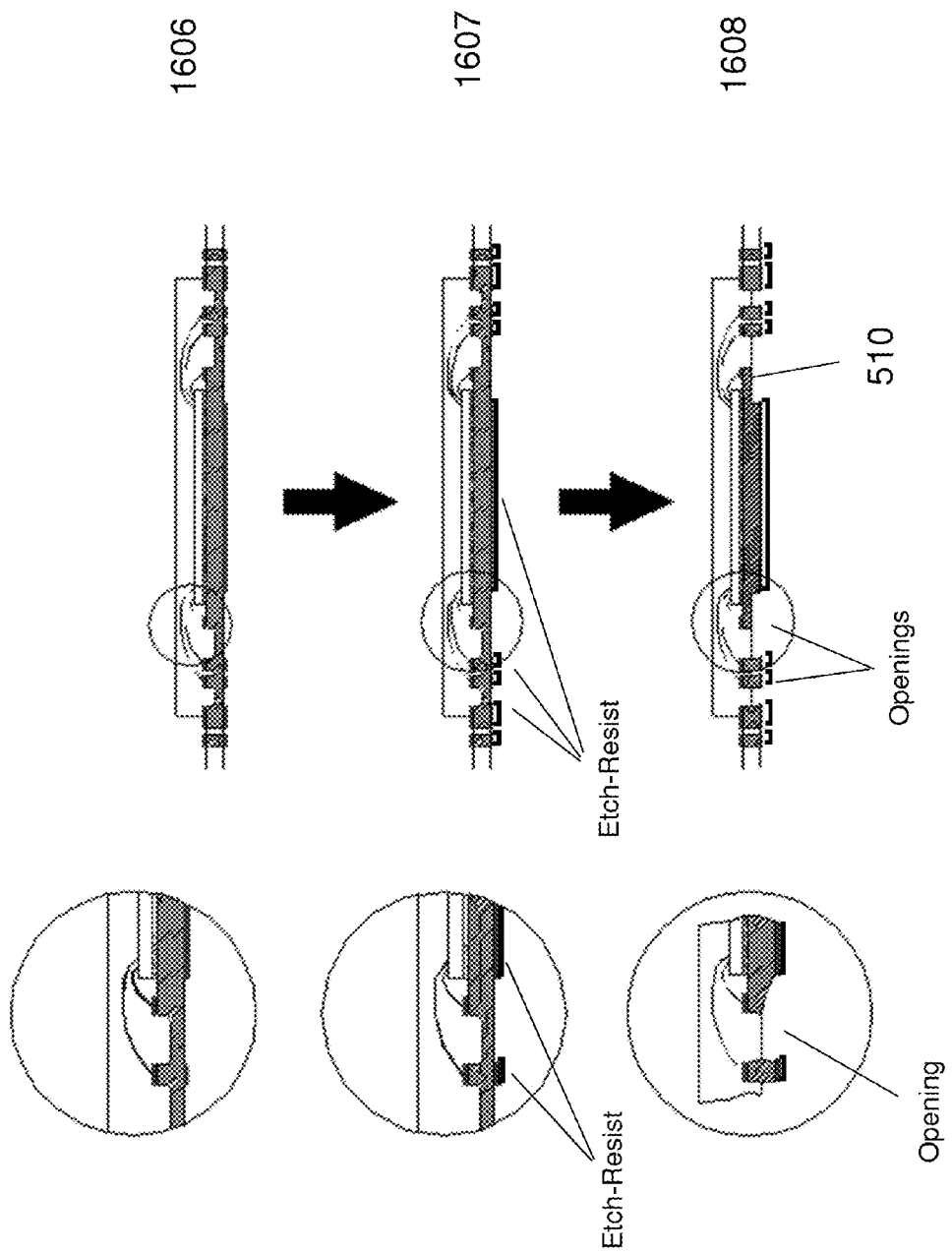

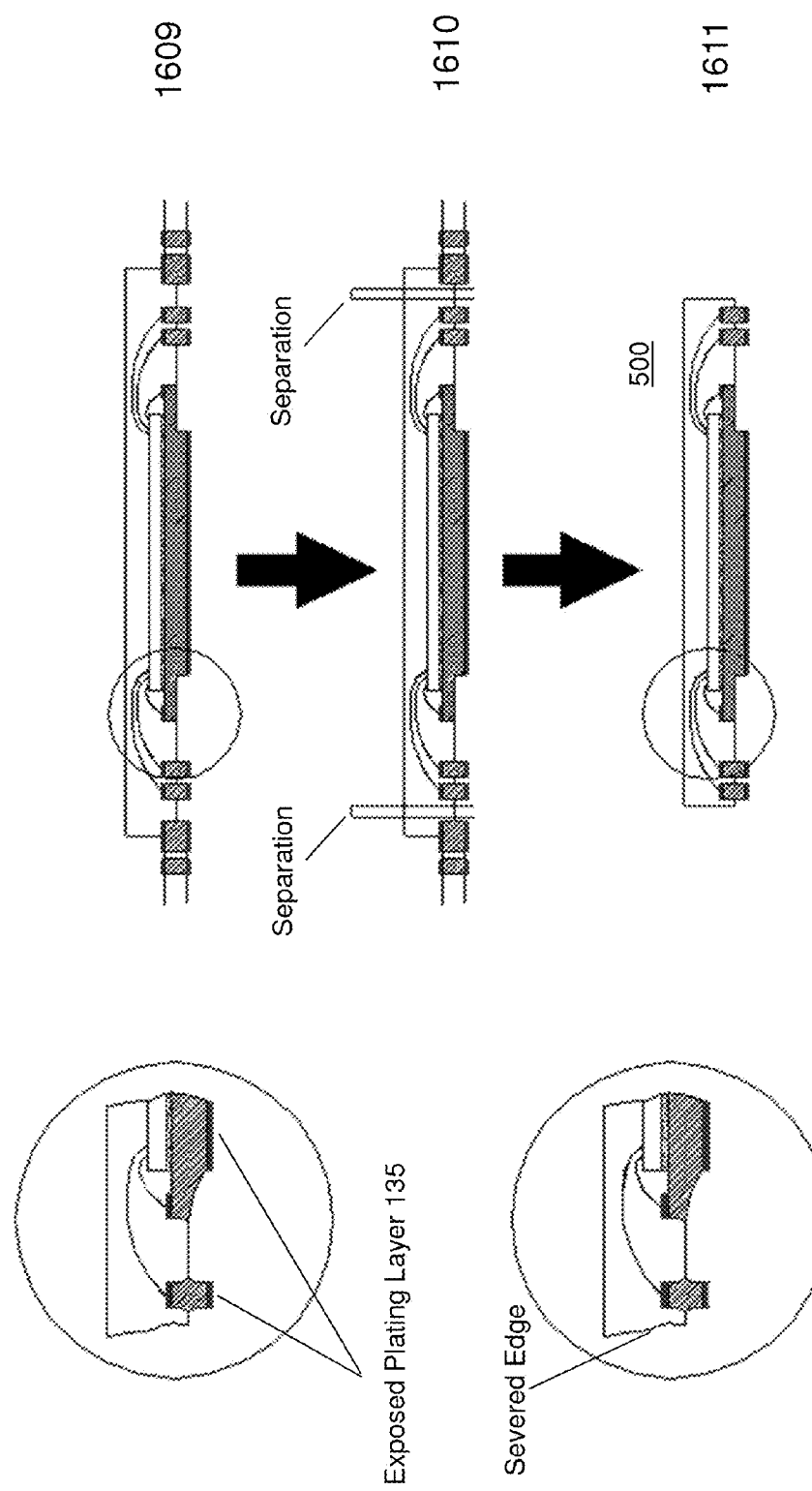

LEADLESS INTEGRATED CIRCUIT PACKAGE HAVING STANDOFF CONTACTS AND DIE ATTACH PAD

CROSS-REFERENCE TO RELATED APPLICATIONS

The present application is a continuation application of U.S. patent application Ser. No. 12/775,711 (issued as U.S. Pat. No. 8,736,037), filed May 7, 2010 entitled, "Leadless Integrated Circuit Package Having Standoff Contacts and Die Attach Pad." U.S. patent application Ser. No. 12/775,711 is a divisional application of U.S. patent application Ser. No. 12/400,391 (issued as U.S. Pat. No. 7,858,443), filed Mar. 9, 2009 entitled, "Leadless Integrated Circuit Package Having Standoff Contacts and Die Attach Pad."

BACKGROUND

1. Technical Field

This invention relates generally to integrated circuit (IC) packaging technology, and more particularly, to leadless IC packages and related methods of manufacture.

2. Description of Related Art

IC packaging is one of the final stages involved in the fabrication of IC devices. During IC packaging, one or more IC chips are mounted on a package substrate, connected to electrical contacts, and then coated with a molding material comprising an electrical insulator such as epoxy or silicone molding compound. The resulting structure—commonly known as an "IC package"—is then connected to other electrical components, for example, on a printed circuit board (PCB).

In most IC packages, the IC chip is completely covered by the molding material, while the electrical contacts are at least partially exposed so that they can be connected to other electrical components. In other words, the electrical contacts are designed to form electrical connections between the IC chip inside the molding material, and electrical components outside the molding material. One of the most common designs for these electrical contacts is one in which they form "leads" extending out the sides of the molding material. The leads typically are bent downward to form connections with electrical components on a PCB.

Unfortunately, the presence of external leads tends to significantly increase the size of IC packages. For instance, it tends to increase the length and width across the IC packages due to the horizontal extension of the leads. This increased size can be disadvantageous in systems where PCB space is limited. In addition, because the external leads are typically arranged along the sides of the IC packages, the pin count of the IC packages is limited by the linear distance around the IC packages. Additionally, these leads require an additional inspection step for straightness, coplanarity and other required mechanical dimensions (and rework or scrap if they fail the specification). Finally, the leads (starting from the bonding fingers down to the tip of the external portions) add to the total electrical signal length (bond wires+leads), which affect the electrical performance of the IC chip.

Recognizing these and other problems with conventional IC packages, researchers have developed IC packages in which the external leads are replaced by electrical contacts that are covered on top by the molding material, but exposed on the bottom of the IC package so they can be connected to electrical components located beneath the IC package. These IC packages—referred to as "leadless" IC packages—tend to occupy less space compared with conventional IC packages due to the absence of the external leads. In addition, these IC packages eliminate the need for bending the leads to form connections.

Some examples of conventional leadless IC packages are disclosed in related and commonly assigned U.S. Pat. Nos. 6,498,099 and 7,049,177, the respective disclosures of which are hereby incorporated by reference. Among other things, these patents describe and illustrate various design variations for leadless IC packages and various techniques for manufacturing and using the leadless IC packages.

SUMMARY

The disclosed embodiments include leadless IC packages in which the electrical contacts extend below a molding layer, forming "standoff" contacts. These IC packages may also include die attach pads formed from the same leadframe strip as the electrical contacts and extending below the surface of the molding layer.

These die attach pads may be exposed through the molding layer to form a direct thermal path from the IC chip down to a copper layer on the PCB. The copper layer may act as a heat sink to dissipate heat generated by the IC chip during normal operation. The exposed die attach pads may vary in size, depending on the size of the IC chip and if ground bonding down to an inside portion of the pad is required. In some embodiments, the exposed die attach pad may be much smaller than the IC chip in order to make room for vias or routing on the PCB underneath the package. In other embodiments, it may be desirable to not have any exposed die attach pad at all, since the presence of exposed metal, in close proximity to circuit traces on a PCB underneath the package may result in interference or undesirable electrical coupling. In yet other embodiments, the exposed die attach pad may have special configurations, such as an array of segmented portions, in order to facilitate surface mounting to the PCB or to provide special electrical connectivity within the die attach pad. In the case of segmented portions, channels created between such segments may also allow out gassing of soldering flux during surface mounting.

In one embodiment, a leadless IC package comprises a die attach pad, an IC chip mounted on the die attach pad, a plurality of electrical contacts electrically connected to the IC chip, and a molding layer formed over the IC chip, the die attach pad, the electrical contacts, and materials used for connection of the IC chip to the electrical contacts, such as bonding wires. The molding layer has a top part covering top portions of the die attach pad and the electrical contacts, and a bottom part through which bottom portions of the die attach pad and electrical contacts are exposed. At least some of the bottom portion of the die attach pad extends out of the bottom part of the molding layer by a smaller distance compared with the bottom portions of one or more of the electrical contacts.

In another embodiment, a leadless IC package comprises an adhesive layer, an IC chip mounted on the adhesive layer, a plurality of electrical contacts electrically connected to the IC chip, and a molding layer formed over the IC chip, the adhesive layer, and the electrical contacts. The molding layer has a top part covering top portions of the electrical contacts, and a bottom part through which a bottom surface of the epoxy layer and bottom portions of the electrical contacts are exposed. The electrical contacts extend out of the bottom part of the molding layer and the adhesive layer is formed in a footprint of the molding layer created by a die attach pad formed from a common metal layer with the electrical contacts.

In yet another embodiment, a method of manufacturing a leadless IC package comprises removing portions of a leadframe strip to form recesses defining areas for a die attach pad and a plurality of electrical contacts. An IC chip is mounted in the die attach pad area and then electrical connections are formed between the electrical contact areas and the IC chip. The IC chip, the die attach pad area, and the electrical contact areas, and the electrical connections are covered with a molding layer. An etch resist layer is formed over the electrical contact areas on a bottom surface of the leadframe strip, and a bottom surface of the leadframe strip is selectively etched using the etch resist layer as an etching mask, thereby forming the electrical contacts and the die attach pad as separate components. The selective etching of the bottom surface of the leadframe strip removes at least a portion of the die attach pad such that a bottom portion of the die attach pad extends away from a bottom surface of the molding layer by a smaller distance compared with bottom portions of one or more of the electrical contacts.

BRIEF DESCRIPTION OF THE DRAWINGS

FIGS. 2A and 2B illustrate a leadless IC package having a partially etched die attach pad that is at the same level as a bottom surface of a molding layer.

FIGS. 5A and 5B illustrate a leadless IC package from which peripheral portions of a die attach pad have been etched away and the bottom of a middle portion of the die attach pad is at the same level as the bottom of external contacts.

FIGS. 6A and 6B illustrate a leadless IC package from which peripheral portions of a die attach pad have been etched by a first amount and a middle portion of the die attach pad has been etched by a second amount.

FIGS. 7A-7B, 8A-8B, and 9A-9B illustrate various leadless IC packages in which a die attach pad has been patterned to form a plurality of discrete protrusions.

FIGS. 10A-10C illustrate various leadless IC packages having die attach pads and electrical contacts formed in various alternative shapes and configurations.

FIGS. 11A-11B, 12A-12B, 13A-13B, and 14A-14B illustrate various leadless IC packages having solder material formed on the bottom of corresponding die attach pads and electrical contacts.

FIGS. 15A-15E illustrate a method of manufacturing a leadless IC package in accordance with one embodiment.

FIGS. 16A-16E illustrate a method of manufacturing a leadless IC package in accordance with another embodiment.

DETAILED DESCRIPTION

Figure 1:
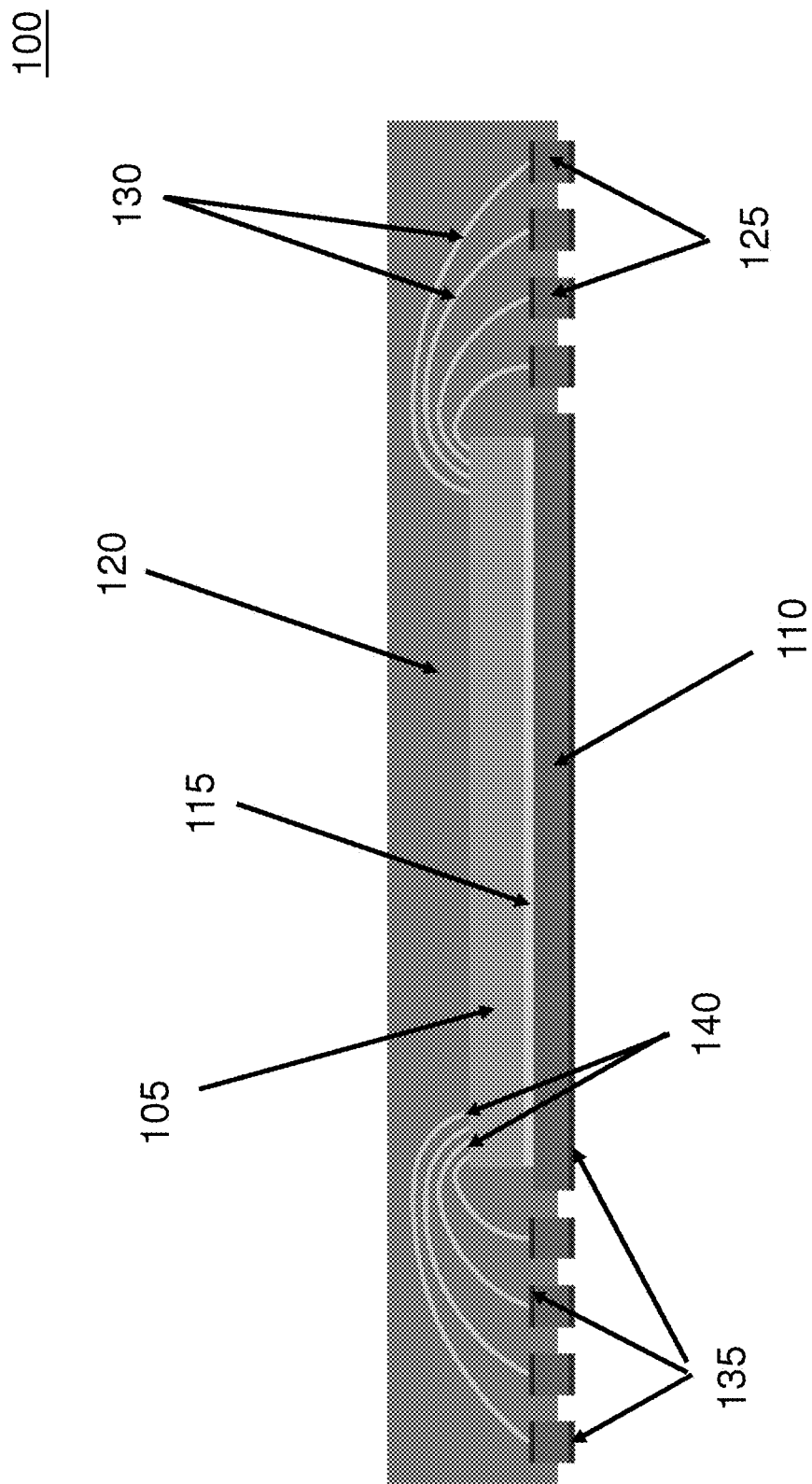
FIG. 1 illustrates a leadless IC package that serves as a reference for explaining other leadless IC packages presented in this written description.

Selected embodiments are described below with reference to the accompanying drawings. These embodiments are provided as teaching examples and should not be construed to limit the scope of the claims. In the drawings, like reference numbers denote like features. Where like features are included in more than one of the illustrated embodiments, these features may be described only once in order to avoid redundancy.

In general, the embodiments relate to leadless IC packages having standoff contacts and/or die attach pads arranged in various configurations. These different configurations can be used to achieve any of several different purposes, such as avoiding electrical and/or physical interference between the die attach pads and circuit traces on a PCB underneath the package, improving heat-transfer characteristics of the die attach pads, facilitating surface mount to the PCB, providing special electrical connectivity within the die attach pad and/or electrical contacts and addressing space-based IC packaging constraints such as pin count, to name but a few.

In the description that follows, a number of embodiments are presented in specific configurations, such as multiple-row quad fine-pitch no-lead package (QFN) configurations where the standoff contacts are arranged in multiple staggered rows on four sides of an IC chip. The disclosed configurations, however, are intended for illustration only and not for any limiting purpose. For example, more than one IC chip may be attached to the die attach pad in a side-by-side configuration, known as multichip module (MCM). The die attach pad itself may be one piece or segmented, in cases where multiple chips that may not share the same backplane. Alternatively, IC chips may be stacked one on top of the other in stacked die configurations. Further, in cases where the package needs to be as small as possible, the package may not have a die attach pad at all. For instance, the IC chip may be attached directly and partially on top of the electrical contacts using an electrically-insulative adhesive (known as chip on lead). The IC chip may also be attached directly to the electrical contacts using flipchip techniques, wherein the bond pads have solder bumps which may be reflowed to upper surfaces of the electrical contacts.

Some embodiments are also described with specific components such as certain types of IC chips including semiconductor processor die. However, these and other components may be substituted with other parts, modified, or supplemented with additional components. For example, passive components, such as chip resistors and capacitors, may be attached to the electrical contacts along with the IC chips (system in package). Moreover, specific materials in the described embodiments, such as certain types of metals, could be substituted with similar materials.

For convenience of explanation, this description includes a number of orientation-specific terms, such as "top," "bottom," "over," "on," and so forth. These terms should not be construed to limit the orientation of the described articles, but are intended merely to reflect the relative positions of various components or portions thereof. For instance, a "bottom surface" may be interpreted to mean a surface opposite a "top surface," regardless of the orientation of the article having the bottom and top surfaces.

FIG. 1 illustrates an example of a leadless IC package 100 in accordance with one embodiment. The embodiment shown in FIG. 1 is used as a reference for explaining a number of additional embodiments below. Thus, the reference numbers shown in FIG. 1 are also used in connection with several other figures.

Referring to FIG. 1, an IC package 100 comprises an IC chip 105, a die attach pad 110, electrical contacts 125, wire bonds 130, and a molding layer 120. IC chip 105 is mounted on die attach pad 110 by an adhesive layer 115. Adhesive layer 115 may comprise, for instance, a polymeric material such as epoxy, silicone, polyimide and thermoplastic materials (both in paste or film form), or a soft solder material such as gold-tin or various combinations of tin and lead alloys. IC chip 105 may comprise, for instance, a processor die or a memory chip cut from a semiconductor wafer.

IC chip 105 includes bonding pads 140 that act as input/output (I/O) terminals and are connected to electrical contacts 125 via wire bonds 130. Both die attach pad 110 and electrical contacts 125 may be covered, on a top surface, by a bondable metal layer 135 which may be plated. Bondable metal layer 135 may comprise a metals such as a stack-up of nickel (Ni), palladium (Pd) and gold (Au), or a stack-up of nickel (Ni) and gold (Au) or silver (Ag). Bottom surfaces of die attach pad 110 and electrical contacts 125 may be plated by the same metal layer as the top surface, or covered with other metal finishes such as silver (Ag), gold (Au), nickel (Ni) and gold (Au), electrolytic or immersion tin (Sn), tin/lead (Sn/Pb), tin alloy or other solder finishes, or hot dip or bare copper (Cu) with a coating of a organic solderability preservative (OSP). Layer 135 may serve any of several functions, including, for instance, enhancing wire bondability of a top layer, protecting the plated surfaces against oxidation, improving solderability, and improving electrical conductivity.

Molding layer 120 covers IC chip 105, wire bonds 130, die attach pad 110, and electrical contacts 125, but leaves portions of die attach pad 110 and electrical contacts 125 exposed on a bottom surface of IC package 100. The exposed portions of die attach pad 110 and electrical contacts 125 protrude from molding layer 120 to form a "standoff" die attach pad and "standoff" contacts, respectively. In other words, the term "standoff" indicates that electrical contacts 125 and die attach pad 110 protrude, or "stand off", from the bottom surface of molding layer 120 by a measurable distance, e.g., 0.0005 to 0.020 inches.

The exposed part of die attach pad 110 can be used as a solder surface for soldering IC package 100 to a PCB or another substrate. It can also serve as a thermal dissipation surface or heat sink for drawing heat off of IC chip 105 during operation. The exposed portions of electrical contacts 125, on the other hand, can create electrical connections between IC chip 105 and electrical components outside IC package 100.

Die attach pad 110 and electrical contacts 125 are typically formed from a single strip of metal such as copper. This strip—denoted a "leadframe" strip—can be used as a platform for simultaneously manufacturing several IC packages. For instance, several IC packages can be simultaneously manufactured by etching patterns for multiple die attach pads and corresponding electrical contacts on a single leadframe strip, placing IC chips on the die attach pads, wire bonding the chips to the electrical contacts, coating the entire structure with a molding layer, and then separating the resulting structure into individual IC packages, e.g., by saw singulation or die punching. Because die attach pad 110 and electrical contacts 125 are typically formed from the same leadframe strip, they also typically (though not always) have the same initial thickness.

IC package 100, once mounted on a PCB or other substrate, may be located in close proximity to other electrical components. For instance, it may be placed directly over components such as routing wires in order to maximize the use of space on the PCB. If IC package 100 is close enough to other components, the exposed portions of die attach pad 110 and electrical contacts 125 may create electrical and/or physical interference with the other components. As an example, the exposed portion of die attach pad 110 may cause electrical shorts or capacitive interference in the routing wires due to its location and/or shape. Accordingly, various embodiments described below include features that may reduce the incidence of such interference. In addition, die attach pad 110 may also be advantageously patterned to achieve improved circuit routing capabilities on a PCB underneath the IC package. Moreover, the patterning of die attach pad 110 may provide channels through which gases from a solder paste may escape during a heating process when the IC package is attached to the PCB or other substrate. When trapped, these gases have been known to cause large voids and/or lift the IC package, causing an unreliable solder attachment. A number of the described embodiments include features that may contribute to these improved capabilities.

FIG. 2A illustrates a leadless IC package 200 in accordance with another embodiment. IC package 200 has a number of similarities with IC package 100, as indicated by the common reference numbers. However, in IC package 200, the protruding portion of die attach pad 110 has been removed by chemical etching or mechanical grinding to produce a relatively thinner die attach pad 210 that is substantially flush with a bottom surface of molding layer 220. In addition, a top portion of die attach pad 210 is plated with metal layer 135 to form a ground ring 245 for ground bond application on die attach pad 210.

IC package 200 can be connected to a PCB or another substrate by soldering one or more of electrical contacts 125 to corresponding PCB lands. Alternatively, die attach pad 210 may remain detached from (not soldered to) the PCB or substrate. Because die attach pad 210 is thinner than electrical contacts 125, it can maintain a distance from electrical components or circuit traces on the PCB or substrate located below IC package 200 to avoid creating electrical or physical interference.

FIG. 2B illustrates the bottom of IC package 200 when it is formed in a staggered multi-row QFN configuration with electrical contacts 125 on four sides. As seen in FIG. 2B, die attach pad 210 covers a relatively large surface area at the bottom of IC package 200, allowing circuit traces or other components on the PCB underneath the area defined by IC chip 105 to be present without electrical or physical interference with the exposed die attach pad 210. Contacts 125 are formed in two staggered rows around die attach pad 210 to create high terminal density while allowing the wire bonds 130 that connect electrical contacts 125 with IC chip 105 to be adequately spaced apart from each other in accordance with the staggered configuration.

Figure 3B:
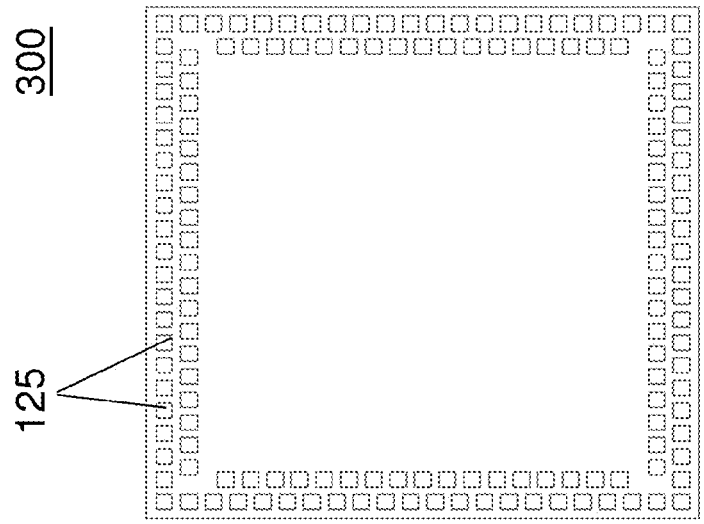
FIGS. 3A and 3B illustrate a leadless IC package from which a die attach pad has been completely removed and covered with a protective and/or insulating layer which is shown as a black substance.
Figure 3A:
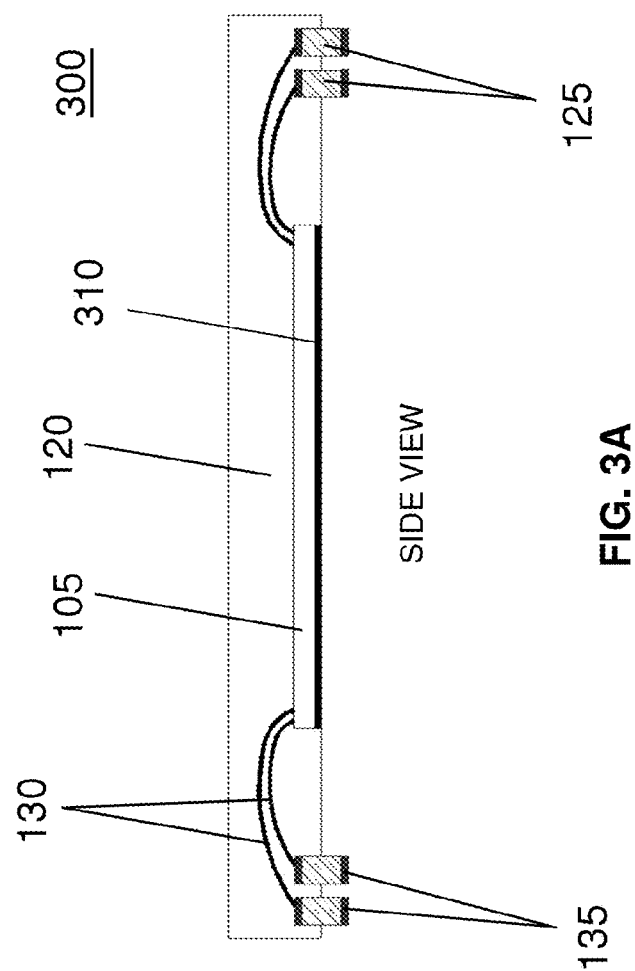

FIG. 3A illustrates a leadless IC package 300 in accordance with another embodiment. IC package 300 is also similar to IC package 100, with the following differences.

In IC package 300, IC chip 105 is mounted directly to a metal strip, such as copper, on a central portion of the strip circumscribed by electrical contacts 125. IC chip 105 is attached using an adhesive layer of black-colored epoxy or another polymer material, such as silicone, polyimide or thermoplastic (either in paste or film form) prior to the formation of molding layer 120. Before IC chip 105 is mounted on the central portion of the copper strip circumscribed by electrical contacts 125, a top portion of the copper strip is pre-etched so that IC chip 105 can be mounted in a plane located below a top surface of electrical contacts 125. Molding layer 120 is subsequently formed over IC chip 105, wire bonds 130, and electrical contacts 125. After molding layer 120 is formed, the remaining portion of the die attach pad is completely removed by chemical etching or mechanical grinding. Thereafter, the surface below IC chip 105 is covered with an epoxy layer 310. In the current example, epoxy layer 310 is the same color as molding layer 120 (e.g., black) so that IC chip 105 is not visible from the bottom of IC package 300, as illustrated by the large blank spot at the middle of FIG. 3B.

Figure 4B:
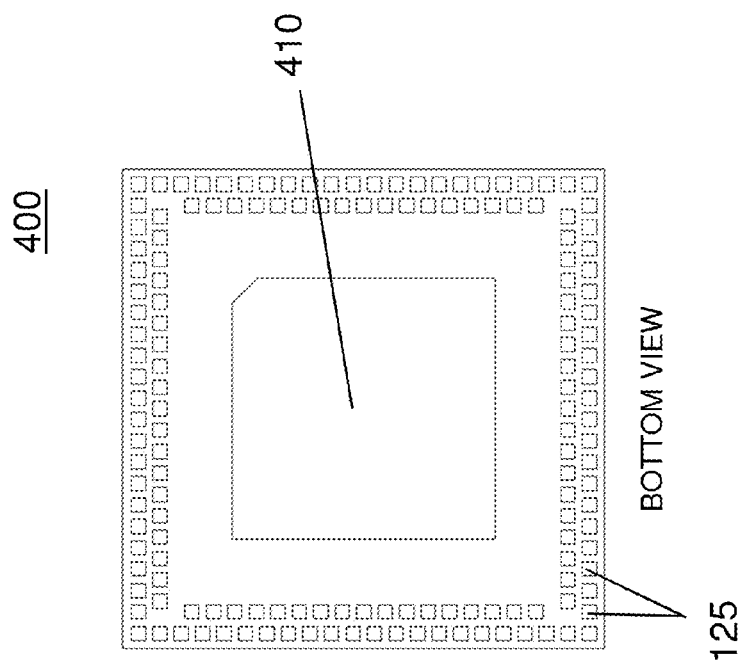
FIGS. 4A and 4B illustrate a leadless IC package from which a die attach pad has been completely removed as in FIG. 3 and a recess is formed in a footprint of the die attach pad.
Figure 4A:
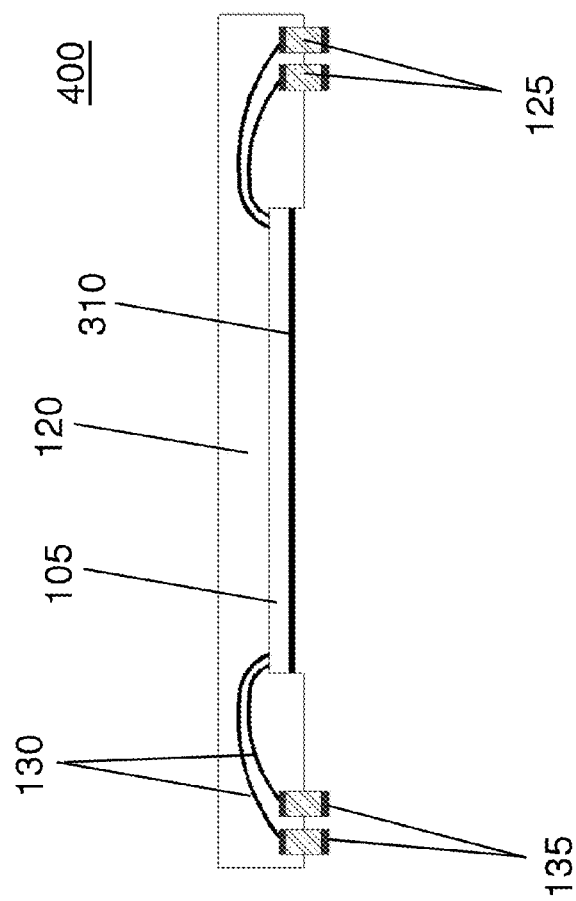

FIG. 4A illustrates a leadless IC package 400, which is a variation of IC package 300. In IC package 400, IC chip 105 and epoxy layer 310 are recessed away from the bottom surface of molding layer 120 by 5 to 30% of the molded thickness—e.g., 1 to 3 mils (28 to 76 microns). The depth of the recess can be controlled, for instance, by varying the amount of pre-etching of the die attach pad. Less pre-etching may result in a deeper recess and more pre-etching may result in a more shallow recess.

The recess is created by removing the remaining die attach pad using chemical etching or mechanical grinding. After the die attach pad is completely removed, the bottom surface of IC chip 105 is covered with epoxy layer 310, which may be the same color as molding layer 120. The resulting structure has a footprint 410 on its bottom surface, as seen in FIG. 4B.

FIG. 5A illustrates a leadless IC package 500 in accordance with another embodiment. IC package 500 is similar to IC package 100, except that in IC package 500, a peripheral portion 510 of the exposed die attach pad 110 has been thinned by chemical etching or mechanical grinding. As a result, the outer edges of die attach pad 110 are substantially flush with the bottom surface of molding layer 120. The peripheral portion 510 may also be flush with or even recessed from the bottom of molding layer 120. FIG. 5B shows a bottom surface of IC package 500, including the peripheral portion 510 that has been thinned on die attach pad 110. Note that this thinned down portion 510 increases the physical separation between contacts 125 and exposed die attach pad 110 and allows for the presence of circuit traces or vias on the PCB directly below that area of IC package 500 and reduces the chance of shorting between the die attach area and the 1$^{st}$ row of electrical contacts during soldering of the IC package to the PCB or substrate.

FIG. 6A illustrates a leadless IC package 600 in accordance with another embodiment. IC package 600 is similar to IC package 100, except a peripheral portion 610 and a central portion 615 of die attach pad 110 have both been thinned by chemical etching or mechanical grinding such that peripheral portion 610 of die attach pad 110 is flush with the bottom surface of molding layer 120, and central portion 615 remains slightly thicker than peripheral portion 610. In other words, central portion 615 has been etched or grinded to a first depth and peripheral portion 610 has been etched or grinded to a second depth greater than the first depth. FIG. 6B shows a bottom surface of IC package 600, including the portions 610 and 615 that have been thinned on die attach pad 110.

Figure 7B:
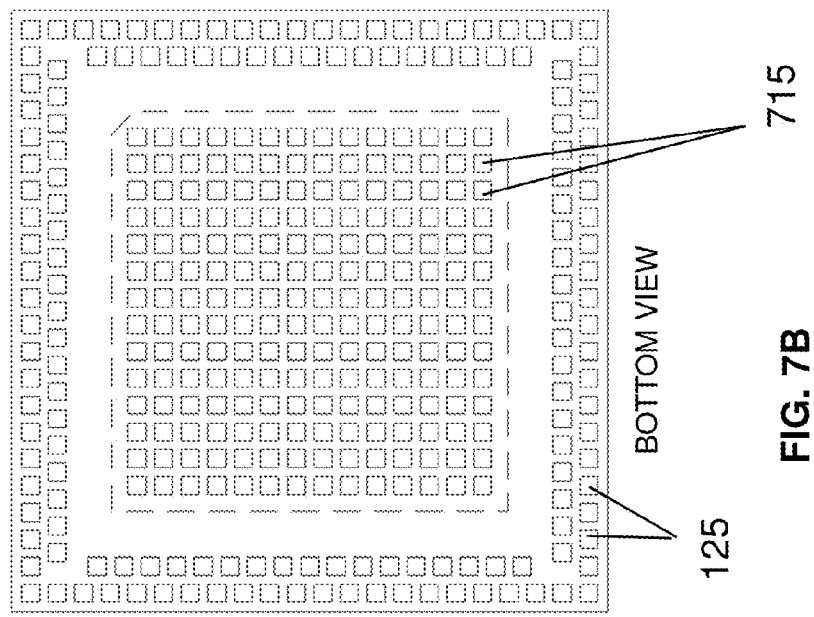
Figure 7A:
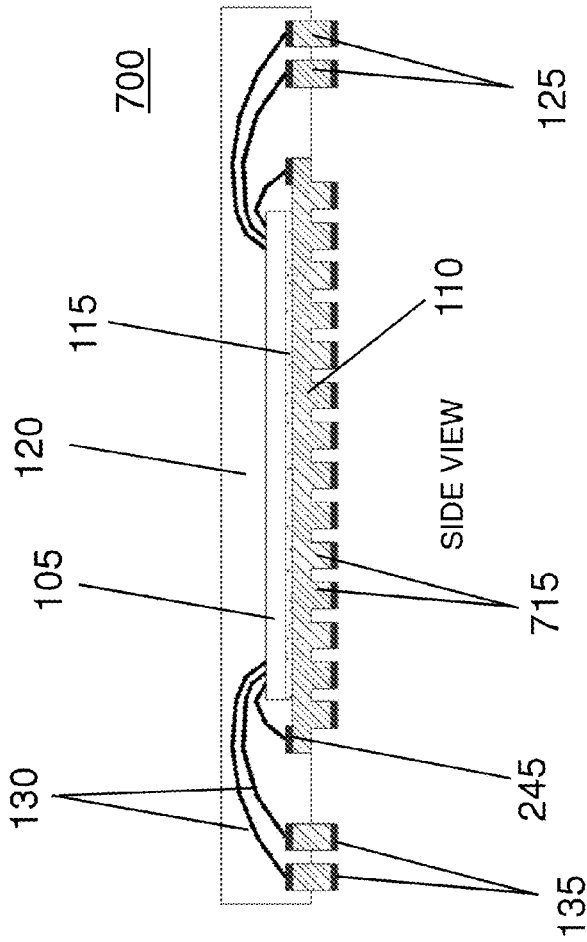

FIGS. 7A and 7B illustrate a leadless IC package 700 in accordance with another embodiment. IC package 700 is similar to IC package 100, except that die attach pad 110 has been etched in specific areas to form a pattern illustrated in FIG. 7A and FIG. 7B. The patterning of die attach pad 110 forms discrete protrusions 715 at regular intervals on the bottom of IC package 700. Protrusions 715 may be referred to as die attach pad electrical contact members (DAP ECMs), although they are not necessarily used as electrical contacts. However, these DAP ECMs 715 have the same exposed bottom size and shape as contacts 125, which allow the same amount of solder paste to be dispensed, thereby facilitating surface mount to the PCB. Another benefit of these discrete protrusions is that they provide channels through which the out gassing of the soldering flux can escape during the surface mount operation.

FIGS. 8A and 8B illustrate a leadless IC package 800 similar to leadless IC package 700. IC package 800, however, includes protrusions 815 that are narrower and shorter compared with protrusions 715 in IC package 700. As a result, the bottom surfaces of protrusions 815 lie in a plane that is nearer to molding layer 120 than are the bottom surfaces of electrical contacts 125.

Figure 9B:
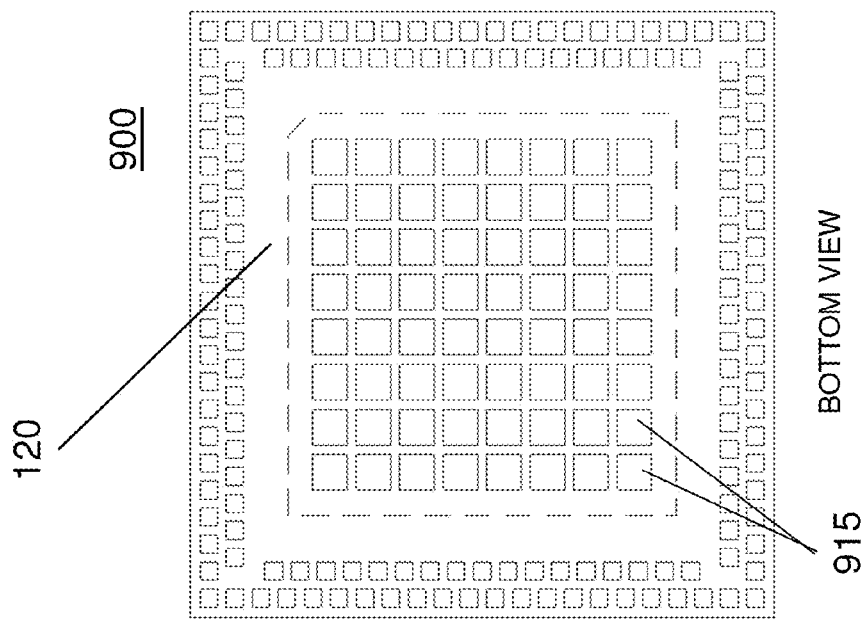
Figure 9A:
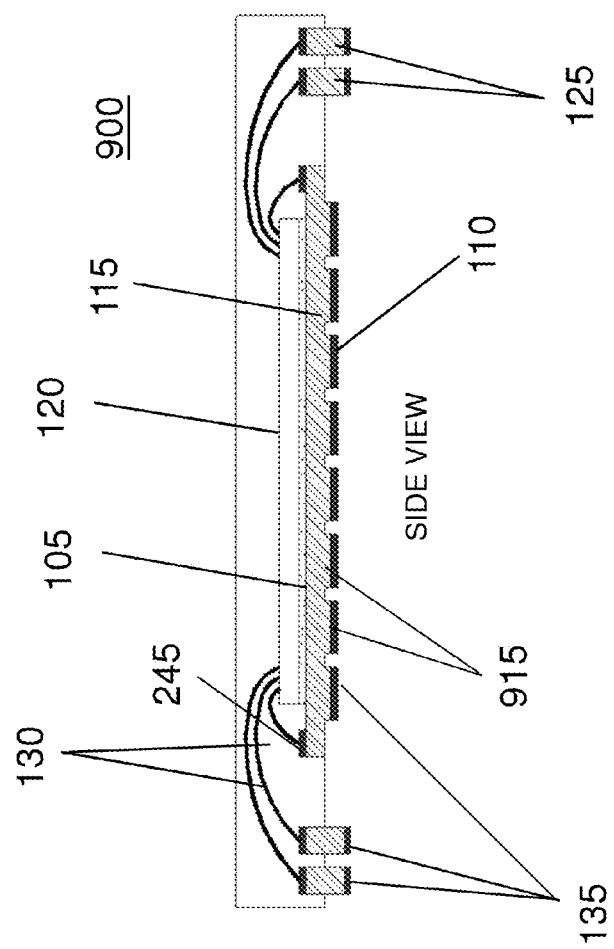

FIGS. 9A and 9B illustrate a leadless IC package 900 similar to leadless IC package 700. IC package 900, however, includes discrete protrusions 915 in die attach pad 110 that are wider and shorter compared with protrusions 715 in IC package 700. As an alternative to the wider and shorter protrusions 915, IC package 700 could also be modified to include protrusions that are longer and narrower, longer and shorter, or wider and longer. In other words, the discrete protrusions 915 can have any number of size and shape variations, depending on the electrical circuit requirements, although the protrusions typically do not extend longer than electrical contacts 125. FIG. 9B shows the bottom of IC package 900 including the wider and shorter protrusions 915.

FIGS. 10A, 10B, and 10C illustrate various alternative configurations 1000 of electrical contacts 125 and DAP ECMs. The alternative configurations of electrical contacts 125 can be achieved, for instance, by modifying the etching pattern of the leadframe strip when electrical contacts 125 are initially defined. The alternative configurations of the DAP ECMs, on the other hand, can be achieved by patterning die attach pad 110 in different ways either before or after molding layer 120 has been formed.

FIG. 10A shows a configuration 1005 of die attach pad 110 with non-uniformly shaped protrusions that form rectangles or squares of different sizes when viewed from a bottom surface. FIG. 10A also shows a configuration 1010 of electrical contacts 125 in which some of the contacts form rectangles or squares of different sizes when viewed from a bottom surface.

FIG. 10B shows a configuration 1020 of electrical contacts 125 in which each contact has a round profile when viewed from a bottom surface. In the example of FIG. 10B, die attach pad 110 has not been patterned.

FIG. 10C shows a configuration 1025 of die attach pad 110 with non-uniformly shaped protrusions that form circles and ovals or ellipses when viewed from a bottom surface. FIG. 10C also shows a configuration 1030 of electrical contacts 125 in which some of the contacts form ovals or circles when viewed from a bottom surface.

Die attach pad 110 and electrical contacts 125 could be formed with a number of alternative shapes and patterns other than those shown in FIGS. 10A-10C. For instance, they could be formed with combinations of round and rectilinear shapes, larger and smaller shapes, and so on. In addition, they could be formed into custom shapes and patterns depending on the desired electrical characteristics and/or connection specifications of a particular IC package.

Figure 11B:
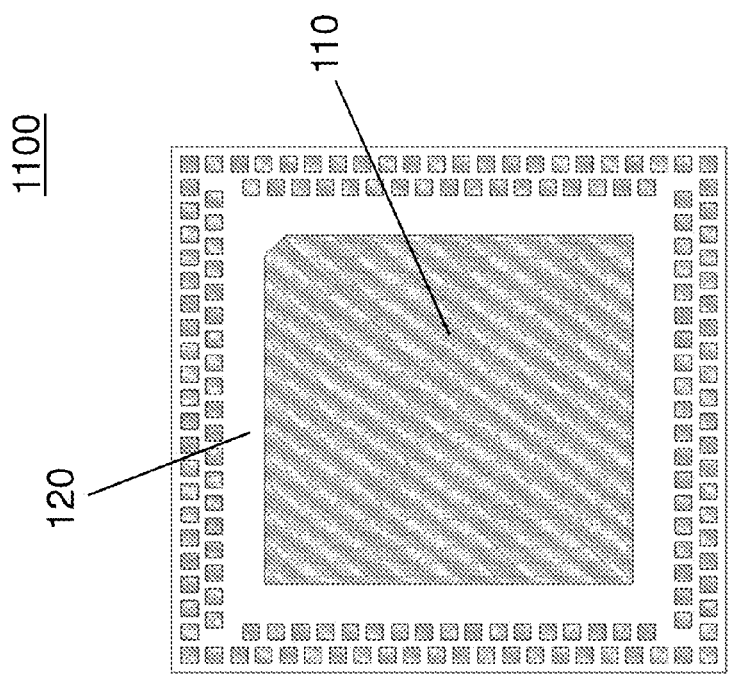
Figure 11A:
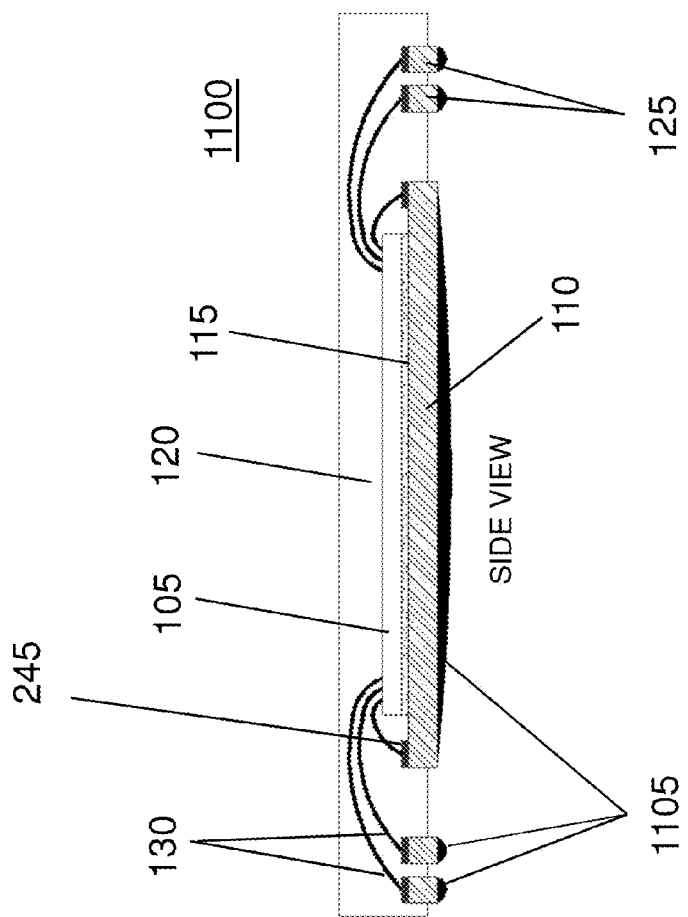

FIGS. 11A and 11B illustrate a leadless IC package 1100 similar to leadless IC package 100. In IC package 1100, however, the electrical contacts 125 and die attach pad 110 have a solder material 1105 attached to their respective contact surfaces. The shaded portions in FIG. 11B indicate the solder material attached to die attach pad 110 and each of electrical contacts 125. The addition of solder material facilitates replacement of bad IC packages during a rework process of a populated PCB. Reworking a PCB may involve removal of the defective IC package, site dressing or cleaning of the PCB area from which the defective IC package was removed, fluxing of the site, placement of the replacement IC package 1100 and solder reflow. Without solder material 1105, a user would have to manually dispense the solder material onto the replacement IC package using a manual stencil, since selective screen printing of the solder material onto the PCB is no longer possible due to the presence of other components on the said PCB.

In some embodiments, solder material 1105 comprises a tin and lead solder alloy. In other embodiments, solder material comprises a non-lead solder alloy such as Tin-Silver, Tin-Silver-Copper, Tin-Silver-Copper-Nickel or a combination of other high-melt solders known to those skilled in the art.

Figure 12B:
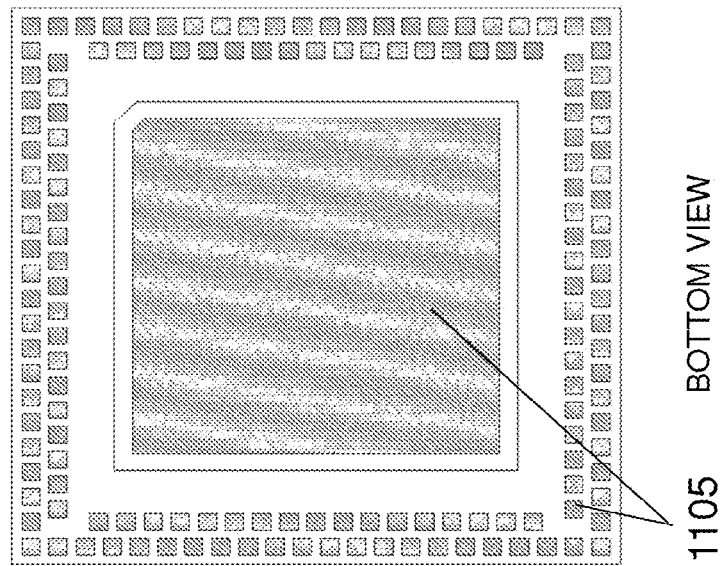
Figure 12A:
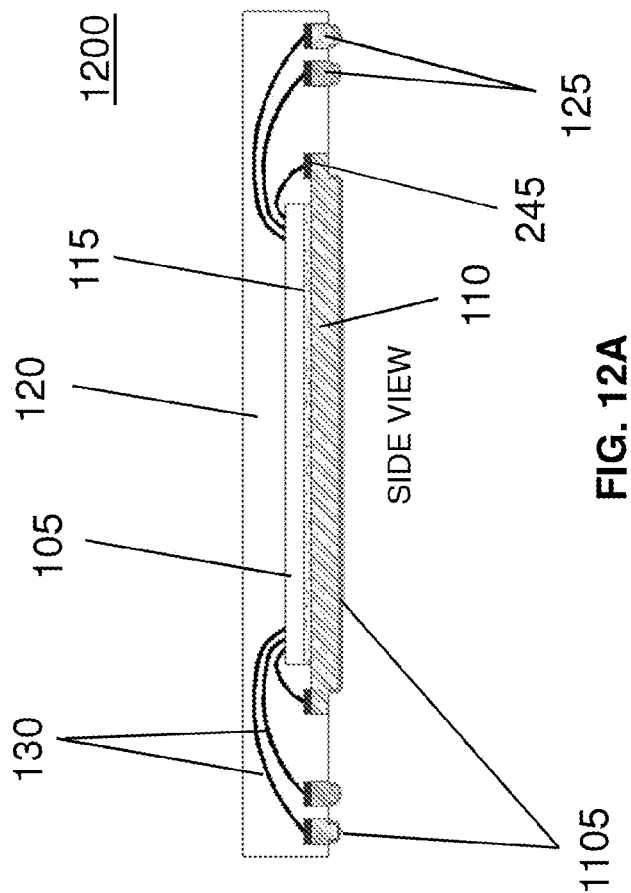

FIGS. 12A and 12B illustrate a leadless IC package 1200 similar to leadless IC package 1100, except that in IC package 1200 electrical contacts 125 and die attach pad 110 have been reduced in size by etching or grinding before the attachment of solder material 1105. This embodiment combines the advantages discussed in relation to IC packages 500 and 1100.

Figure 13B:
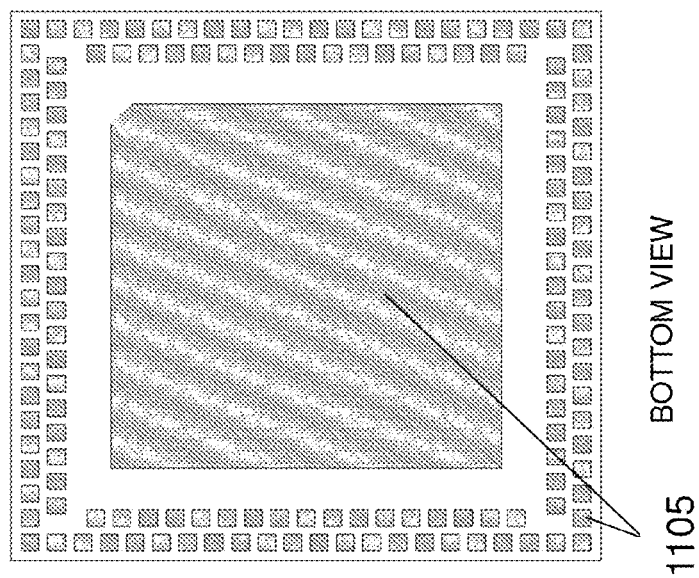
Figure 13A:
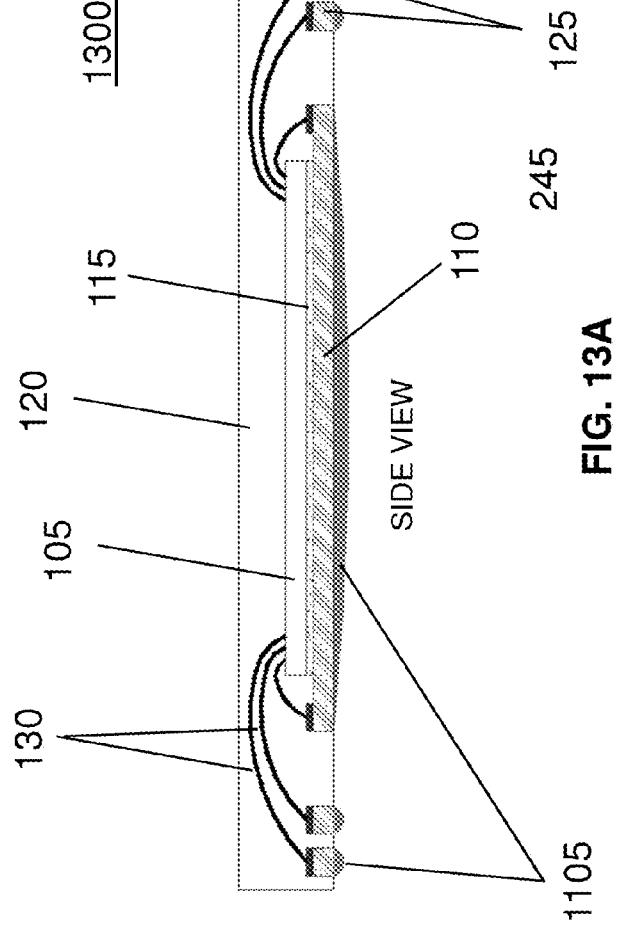

FIGS. 13A and 13B illustrate a leadless IC package 1300 similar to leadless IC package 1200. In IC package 1300, however, electrical contacts 125 and die attach pad 110 have been removed by etching or grinding until they are flush with the bottom surface of molding material 120 prior to the attachment of solder material 1105.

FIGS. 14A and 14B illustrate a leadless IC package 1400 similar to leadless IC package 700, except that in IC package 1400, the bottom of die attach pad 110 and electrical contacts 125 are not covered with plating 135 prior to the application of a solder material 1405, which may be applied in a paste form and reflowed to form a plurality of solder bumps on the discrete protrusions of die attach pad 110 and electrical contacts 125. The attachment of solder material 1405 can be made using any of several well-known application techniques, such as screen printing or pattern-write needle dispensing.

As an alternative to attaching solder material 1405 in the paste form, it could be attached to electrical contacts 125 and the protrusions of die attach pad 110 in the form of preformed solder balls. The solder balls may be attached using a solder paste or flux material and a reflow process. The flux or solder paste material ensures proper solder wetting of die attach pad 110 and electrical contacts 125 during the reflow process.

Any of the embodiments illustrated in FIGS. 11-14 could be modified so that solder is only applied to a subset of the bottom contact surfaces of electrical contacts 125 and die attach pad 110. For instance, in a number of embodiments, die attach pad 110 may not be soldered at all. Similarly, in some embodiments, not all of electrical contacts 125 will be soldered down.

FIGS. 15A-15E illustrate a method of manufacturing a leadless IC package such as IC package 200 illustrated in FIG. 2. The method may be used to simultaneously manufacture several leadless IC packages with a single leadframe strip. However, for simplicity, only one IC package will be illustrated and described. In the description that follows, example method steps will be denoted by parentheses (xxxx) to distinguish them from example IC package components.

Referring to FIG. 15A, the method begins with a leadframe strip formed of copper or another conductive material such as one of various metals or metal alloys (1501). The strip is partially etched to form recesses or patterns defining the area of die attach pad 110 and electrical contacts 125 (1502). The patterns can be formed using any of several conventional etching techniques such as various forms of chemical or mechanical etching. Although not shown, the patterns can be defined initially by forming an etch mask over the leadframe strip and performing the etching based on the etch mask. Once the areas of die attach pad 110 and electrical contacts 125 are formed, top and/or bottom surfaces of those areas are plated with plating layer 135 using a double-sided selective plating process (1503). Plating layer 135 can also form a ground ring 245 on die attach pad for forming ground bonds for IC chip 105. The plating layers 135 and 245 may comprise a metal such as a stack-up of nickel (Ni), palladium (Pd) and gold (Au), a stack-up of nickel (Ni) and gold (Au) or silver (Ag). The plating layer 135 on the bottom surface may be plated by the same metal layer as the top surface, or with other metal finish such as silver (Ag), gold (Au), nickel (Ni) and gold (Au), or tin/lead (Sn/Pb) solder plating.

Referring to FIG. 15B, IC chip 105 is then attached, using an adhesive layer 115, to the area defining die attach pad 110 (1504). The adhesive layer 115 may comprise of either polymeric materials, such as epoxy, silicone, polyimide or thermoplastic materials (both in paste or film form), or soft solder materials, such as gold-tin or various combinations of tin and lead alloys. Thereafter, wire bonds 130 are formed to connect IC chip 105 with electrical contacts 125 and ground ring 245 (1505). Wire bonds 130 may be formed using a conventional wire bonding technology, such as, e.g., gold, copper or aluminum wire bonding.

Referring to FIG. 15C, molding layer 120 is then formed over wire bonds 130, IC chip 105, and the areas defining die attach pad 110 and electrical contacts 125. (1506). Thereafter, an etch-resist layer is selectively formed on the bottom surface of leadframe strip over the areas defining electrical contacts 125 (1507). The bottom surface of the leadframe strip is then back-etched to remove metal portions between the areas defining adjacent electrical contacts 125, between die attach pad 110 and electrical contacts 125, and to partially remove a bottom metal portion of die attach pad 110 (1508). In the resulting structure, a bottom surface of molding layer 120 is exposed through the removed portions between electrical contacts 125 and die attach pad 110 and between adjacent electrical contacts 125. Due to the back-etching, a bottom surface of die attach pad 110 is substantially flush with the bottom surface of molding layer 120.

Referring to FIG. 15D, the etch-resist layer is stripped away from electrical contacts 125 to re-expose plating layer 135 on the bottom surfaces thereof (1509). Once the etch-layer has been stripped away, the resulting package is severed from the rest of the leadframe strip by a singulation process such as saw singulation or mechanical punching (1510). The points of separation are indicated in FIG. 15D by a pair of vertical bars. The separation results in a singulated IC package 200 (1511). An enlarged version of the singulated unit is shown in FIG. 15E with the same labels as FIG. 2.

FIGS. 16A-16E illustrate another method of manufacturing a leadless IC package such as IC package 500 illustrated in FIG. 5. This method may be used to simultaneously manufacture several leadless IC packages with a single leadframe strip.

Referring to FIG. 16A, the method begins with a leadframe strip formed of copper or another conductive material such as one of various metals or metal alloys (1601). The strip is partially etched to form recesses or patterns defining the area of die attach pad 110 and electrical contacts 125 (1602). The top and/or bottom surfaces of the areas defining die attach pad 110 and electrical contacts 125 are then plated with plating layer 135 using a double-sided selective plating process (1603). In the example of FIG. 16A, the same surfaces are plated as in the example of FIG. 15A next to reference number 1503, except that in FIG. 16A, an additional portion is plated on the bottom of the area defining die attach pad 110. Plating layers 135 and 245 may comprise a metal such as a stack-up of nickel (Ni), palladium (Pd) and gold (Au), a stack-up of nickel (Ni) and gold (Au) or silver (Ag). Plating layer 135 on the bottom surface may be plated by the same metal layer as the top surface, or with other metal finish such as silver (Ag), gold (Au), nickel (Ni) and gold (Au), or tin/lead (Sn/Pb) solder plating.

Figure 16B:
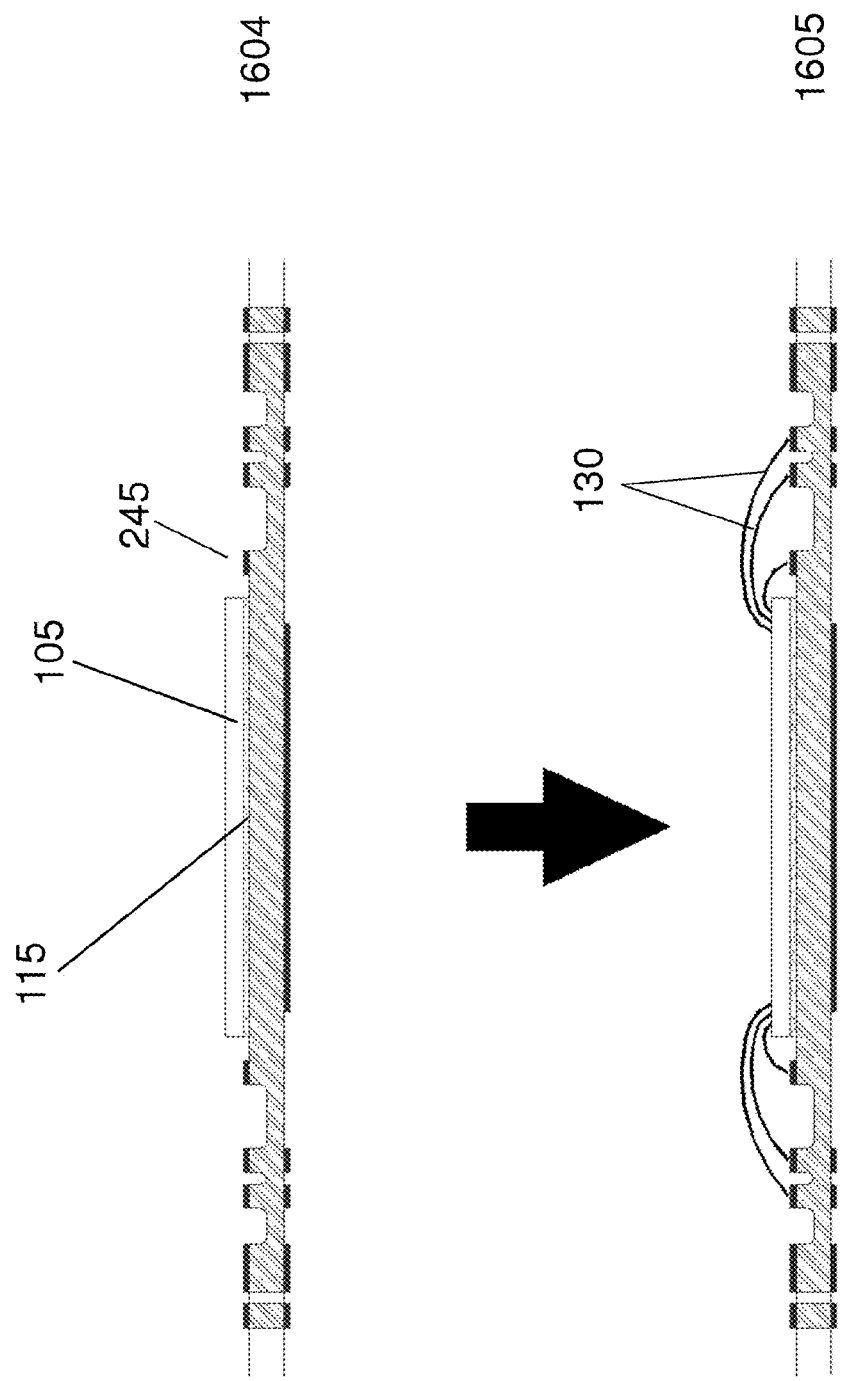

Next, in FIG. 16B, IC chip 105 is attached, using an adhesive layer 115, to the area defining die attach pad 110 (1604). Adhesive layer 115 may comprise polymeric materials such as epoxy, silicone, polyimide or thermoplastic materials (both in paste or film form), or soft solder materials such as gold-tin or various combinations of tin and lead alloys. Thereafter, wire bonds 130 are formed to connect IC chip 105 with electrical contacts 125 and ground ring 245 (1605).

Subsequently, in FIG. 16C, molding layer 120 is formed over wire bonds 130, IC chip 105, and the areas defining die attach pad 110 and electrical contacts 125. (1606). An etch-resist layer is then selectively formed on the bottom surface of leadframe strip over the areas defining electrical contacts 125 and a middle part of the area defining die attach pad 110 (1607). The bottom surface of the leadframe strip is then back-etched to remove metal portions between the areas defining die attach pad 110 and electrical contacts 125, and to partially remove a peripheral portion of die attach pad 110 (1608). In the resulting structure, a bottom surface of molding layer 120 is exposed through the removed portions between electrical contacts 125 and die attach pad 110 and between adjacent contacts 125. In addition, peripheral portions 510 of die attach pad 110 are substantially flush with the bottom surface of molding layer 120.

Figure 16E:
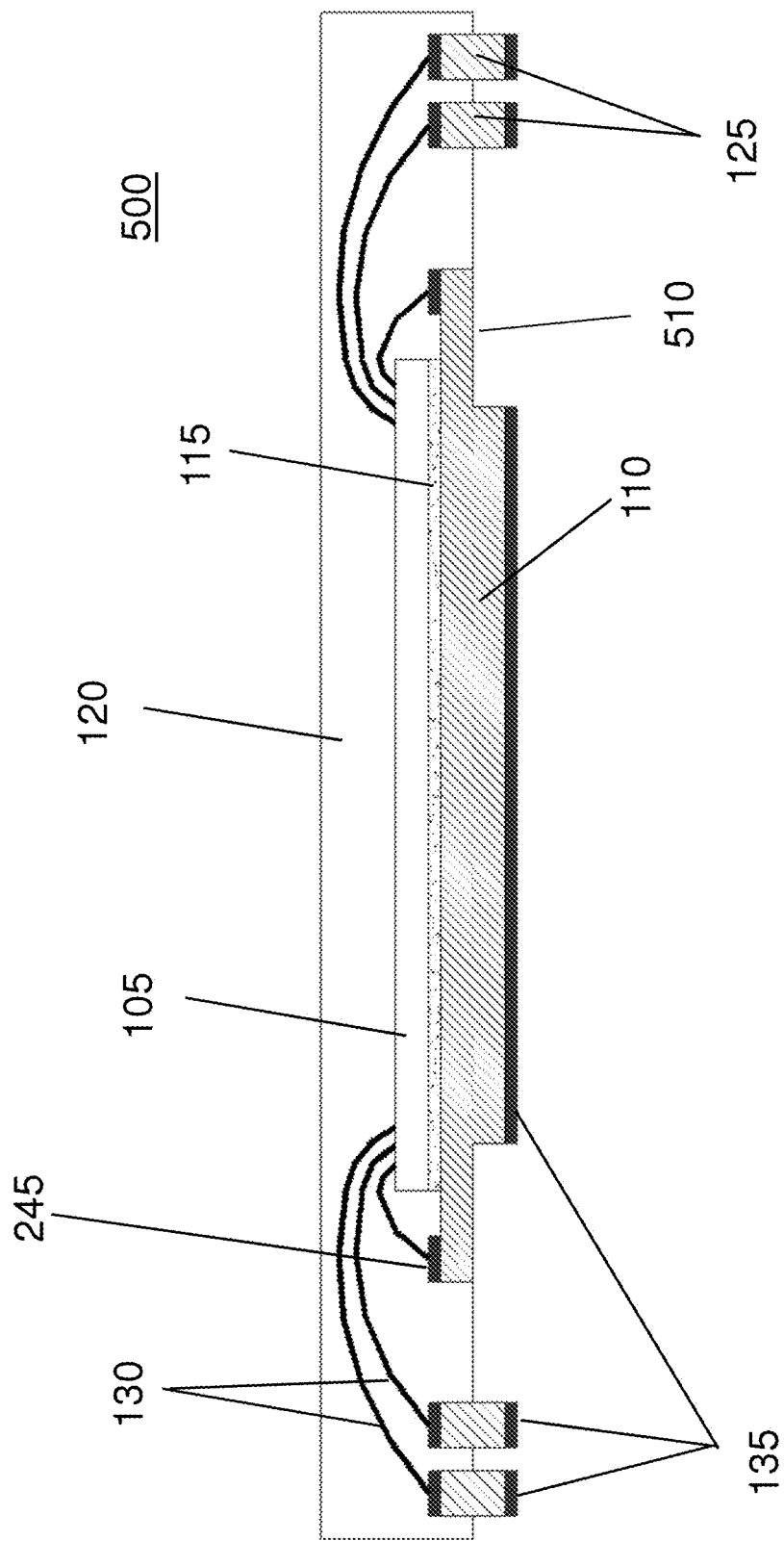

Referring to FIG. 16D, the etch-resist layer is stripped away from electrical contacts 125 and die attach pad 110 to re-expose plating layer 135 on the bottom surfaces thereof (1609). The resulting package is then severed from the rest of the leadframe strip by a singulation process such as saw singulation or mechanical punching (1610). The points of separation are indicated in FIG. 16D by a pair of vertical bars. The separation results in a singulated IC package 500 (1611). An enlarged version of the singulated IC package 500 is shown in FIG. 16E with the same labels as FIG. 5.

In view of the foregoing, it should be appreciated that leadless IC packages can be formed with electrical contacts and die attach pads having any of several different configurations to achieve a variety of different results. The different configurations can be achieved using manufacturing techniques such as those discussed above or any of several variations and/or substitutes available to those skilled in the art.

What is claimed:

1. A leadless integrated circuit (IC) package, comprising:
    a die attach pad having a top surface and a bottom surface, the die attach pad being a single discrete element having a center portion and a peripheral portion;
    an IC chip mounted on the top surface of the die attach pad in the peripheral portion thereof, the top surface of the die attach pad having an area larger than an area of the IC chip mounted thereagainst;
    a plurality of electrical contacts electrically connected to the IC chip;
    a molding layer formed over the IC chip, the die attach pad, and the electrical contacts, the molding layer having a top part covering top portions of the electrical contacts and a bottom part through which the bottom surface of the die attach pad and bottom portions of the electrical contacts are exposed, the bottom part having an exposed surface disposed between the die attach pad and electrical contacts;
    a ground ring on the top surface of the peripheral portion of the die attach pad;
    wherein the bottom surface of the peripheral portion of the die attach pad is substantially flush with an exposed surface of the bottom part of the molding layer;
    wherein the bottom portions of one or more of the plurality of electrical contacts extend out of the bottom part of the molding layer; and
    wherein the bottom surface of the center portion of the die attach pad extends out of the bottom part of the molding layer by a distance less than a distance that the bottom portions of one or more of the electrical contacts extends out of the exposed surface of the bottom part of the molding layer.

2. The IC package of claim 1, further comprising:
    a ground ring on the top surface of the peripheral portion of the die attach pad.

3. The IC package of claim 2, wherein the ground ring is disposed on portion of the die attach pad whose bottom surface is substantially flush with the bottom part of the molding layer.

4. The IC package of claim 1, wherein the entire bottom surface of the center portion of the die attach pad is substantially flat.

5. The IC package of claim 1, wherein the bottom surface of the center portion of the die attach pad has an area that is smaller than an area of the IC chip.

6. The IC package of claim 1, wherein the bottom surface of the center portion of the die attach pad comprises a plurality of discrete protrusions.

7. The IC package of claim 1, wherein the bottom surface of the center portion of the die attach pad has an area that is smaller than the area of the IC chip.

8. The IC package of claim 7, wherein each of the electrical contacts has a top surface and a bottom surface, each of the bottom surfaces of the electrical contacts having an area that is smaller than an area of the top surfaces of the electrical contacts.

9. The IC package of claim 8, further comprising a solder material formed on at least one of the electrical contacts and the die attach pad.

10. The IC package of claim 9, wherein the solder material comprises a tin and lead solder alloy.

* * * * *